(12) United States Patent
Goto et al.

(10) Patent No.: US 10,291,154 B2
(45) Date of Patent: May 14, 2019

(54) DRIVING DEVICE

(71) Applicant: Murata Manufacturing Co., Ltd., Nagaokakyo-shi, Kyoto-fu (JP)

(72) Inventors: Seishiro Goto, Nagaokakyo (JP); Megumi Otsuka, Nagaokakyo (JP); Junichi Nomura, Nagaokakyo (JP); Koichi Hayashi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 377 days.

(21) Appl. No.: 15/164,120

(22) Filed: May 25, 2016

(65) Prior Publication Data

US 2016/0268928 A1 Sep. 15, 2016

Related U.S. Application Data

(63) Continuation of application No. PCT/JP2014/069016, filed on Jul. 17, 2014.

(30) Foreign Application Priority Data

Nov. 27, 2013 (JP) ................................. 2013-244599
Jan. 20, 2014 (JP) ................................. 2014-007586

(51) Int. Cl.
*H02N 2/00* (2006.01)
*H02N 2/02* (2006.01)
(Continued)

(52) U.S. Cl.
CPC .............. *H02N 2/001* (2013.01); *G02B 7/08* (2013.01); *H01L 41/042* (2013.01);
(Continued)

(58) Field of Classification Search
CPC ...... H02N 2/001; H02N 2/026; H01L 41/042; H01L 41/09
See application file for complete search history.

(56) References Cited

U.S. PATENT DOCUMENTS

2007/0132341 A1* 6/2007 Tokumiya ............ H02N 2/0065
310/328
2007/0164635 A1 7/2007 Witteveen et al.
(Continued)

FOREIGN PATENT DOCUMENTS

CN 101019301 A 8/2007
CN 101946396 A 1/2011
(Continued)

OTHER PUBLICATIONS

International Search Report issued for PCT/JP2014/069016, dated Oct. 28, 2014.
(Continued)

*Primary Examiner* — Bryan P Gordon
(74) *Attorney, Agent, or Firm* — Arent Fox LLP

(57) ABSTRACT

A driving device that causes a movable body to move stably with minimal backward movement. The driving device includes a plate-shaped driving unit with an elastic body and a piezoelectric element joined to a main surface of the elastic body. Moreover, the movable body is disposed into a cavity of the elastic body and is moved by being pitch fed when the driving unit is driven. The driving unit vibrates with flexural vibration and one more other vibration modes or with vibration of a coupled mode in which the flexural vibration and the other vibration mode are coupled with each other.

20 Claims, 22 Drawing Sheets

(51) Int. Cl.
 *G02B 7/08* (2006.01)
 *H01L 41/04* (2006.01)
 *H01L 41/053* (2006.01)
 *H01L 41/09* (2006.01)

(52) U.S. Cl.
 CPC ............ *H01L 41/053* (2013.01); *H01L 41/09* (2013.01); *H02N 2/003* (2013.01); *H02N 2/0015* (2013.01); *H02N 2/026* (2013.01)

(56) References Cited

U.S. PATENT DOCUMENTS

| | | | | |
|---|---|---|---|---|
| 2010/0245517 | A1* | 9/2010 | Miyazawa | B41J 23/00 347/104 |
| 2011/0031847 | A1* | 2/2011 | Sakamoto | H02N 2/026 310/323.02 |
| 2011/0057542 | A1* | 3/2011 | Kudo | H02N 2/026 310/323.02 |
| 2013/0033152 | A1* | 2/2013 | Yamasaki | G02B 7/102 310/323.02 |

FOREIGN PATENT DOCUMENTS

| | | |
|---|---|---|
| JP | S63114576 A | 5/1988 |
| JP | S63220781 A | 9/1988 |
| JP | H01298968 A | 12/1989 |
| JP | 06106029 B2 | 12/1994 |
| JP | 2009219280 A | 9/2009 |
| JP | 4492756 B2 | 6/2010 |
| JP | 2011041335 A | 2/2011 |

OTHER PUBLICATIONS

Written Opinion of the International Searching Authority issued for PCT/JP2014/069016, dated Oct. 28, 2014.

* cited by examiner

DRIVING DEVICE

CROSS REFERENCE TO RELATED APPLICATIONS

The present application is a continuation of PCT/JP2014/069016 filed Jul. 17, 2014, which claims priority to Japanese Patent Application No. 2013-244599, filed Nov. 27, 2013, and Japanese Patent Application No. 2014-007586, filed Jan. 20, 2014, the entire contents of each of which are incorporated herein by reference.

FIELD OF THE INVENTION

The present disclosure relates to a driving device that causes a movable body to move by driving a piezoelectric element, and more specifically relates to a driving device that utilizes a plurality of vibration modes.

BACKGROUND

To date, a variety of driving devices that use piezoelectric elements have been proposed as driving devices for causing a lens or the like to move. In below-listed Patent Document 1, a driving member is used that is displaced in an axial direction on the basis of an expansion/contraction operation of a piezoelectric body. A member that is to be driven can be moved by being engaged with this driving member through a frictional force. In Patent Document 1, the to-be-driven member is pitch fed in the axial direction by repeatedly performing an operation in which driving is performed by applying a voltage to the piezoelectric body in a direction that is the same as the polarization direction of the piezoelectric body and an operation in which driving is performed by applying a voltage in the opposite direction.

On the other hand, in below-listed Patent Document 2, an ultrasonic motor is disclosed that utilizes flexural vibration and another kind of vibration. Here, a configuration is adopted in which a cylindrical slider is inserted into a through hole of a disk-shaped substrate and the slider moves in an axial direction thereof. Piezoelectric elements are provided on both surfaces of the disk-shaped substrate and composite resonance made up of flexural vibration and radial-direction vibration of the disk is generated in the substrate.

Patent Document 1: Japanese Patent No. 4492756.
Patent Document 2: Japanese Unexamined Patent Application Publication No. 1-298968.

In the driving device described in Patent Document 1, the movable body is unable to satisfactorily follow the axial expansion and contraction of the driving member. Consequently, the movable body cannot be pitch fed with certainty. In addition, the movable body sometimes moves backward in a forward movement period. Therefore, it is difficult to make the movement speed of the movable body high and the movement speed is unstable.

On the other hand, in Patent Document 2, composite resonance made up flexural vibration and radial-direction vibration is utilized. In this case, it is not easy to generate flexural vibration and radial-direction expansion-contraction vibration with the same period. Consequently, it is difficult to pitch feed the movable body and it is also difficult to stabilize the movement speed of the movable body.

SUMMARY OF THE INVENTION

An object of the present disclosure is to provide a driving device that can cause a movable body to move stably, with which backward movement of the movable body is unlikely to occur and that can stabilize the movement speed of the movable body.

A driving device is disclosed that includes a plate-shaped driving unit that includes a plate-shaped elastic body having first and second main surfaces that oppose each other and a cavity that extends from the first main surface to the second main surface in the center of the elastic body, and a piezoelectric element that is joined to at least one of the main surfaces of the plate-shaped elastic body; and a movable body that is inserted into the cavity of the plate-shaped elastic body and that is moved in a direction that connects the first main surface and the second main surface of the plate-shaped elastic body as a result of the driving unit being driven. The plate-shaped driving unit is configured to vibrate with flexural vibration and at least one other type of vibration that is different to the flexural vibration or with a vibration of a coupled mode in which the flexural vibration and the at least one other type of vibration that is different to the flexural vibration are coupled with each other as a result of the piezoelectric element being driven. The other type of vibration or the vibration of the coupled mode has a vibration shape that realizes a movable state in which an inner wall of the cavity of the elastic body is frictionally engaged with the movable body such that the movable body can be made to move and a released state in which the inner wall of the cavity of the elastic body is separated from the movable body or is contacting the movable body with a frictional engagement force that is lower than that in the movable state. The movable body is made to move by the flexural vibration and the other type of vibration of the driving unit or by the vibration of the coupled mode of the driving unit.

In a certain specific aspect of the driving device according to the present invention, the plate-shaped driving unit is configured to vibrate with the flexural vibration and the at least one other type of vibration that is different to the flexural vibration as a result of the piezoelectric element being driven, and the other type of vibration has a vibration shape that realizes a movable state in which the inner wall of the cavity of the elastic body is frictionally engaged with the movable body such that the movable body can be made to move by the flexural vibration and a released state in which the inner wall of the cavity of the elastic body is separated from the movable body or is contacting the movable body with a frictional engagement force that is lower than that in the movable state, and the movable body is made to move by being pitch fed by the flexural vibration and the other type of vibration of the driving unit.

In another specific aspect of the driving device according to the present invention, driving is performed such that the flexural vibration and the other type of vibration have the same period.

In another specific aspect of the driving device according to the present invention, the plate-shaped driving unit is configured to vibrate with the vibration of the coupled mode as a result of the piezoelectric element being driven, and the vibration of the coupled mode has a vibration shape that realizes a movable state in which the inner wall of the cavity of the elastic body is frictionally engaged with the movable body such that the movable body can be made to move and a released state in which the inner wall of the cavity of the elastic body is separated from the movable body or is contacting the movable body with a frictional engagement force that is lower than that in the movable state, and the movable body is made to move by the vibration of the coupled mode of the driving unit.

In another specific aspect of the driving device according to the present invention, dimensions of the elastic body are adjusted such that the flexural vibration and the other type of vibration couple with each other and the coupled mode is excited.

In another specific aspect of the driving device according to the present invention, a planar shape of the movable body is a non-circular anisotropic shape.

In another specific aspect of the driving device according to the present invention, a planar shape of the cavity is a non-circular anisotropic shape.

In another specific aspect of the driving device according to the present invention, the movable body has a side surface that extends in the movement direction and that can frictionally engage with the cavity of the elastic body and the side surface is provided with a pressing contact member that increases the frictional engagement force against the cavity of the elastic body.

In another specific aspect of the driving device according to the present invention, the pressing contact member is a ring-shaped member that extends in peripheral direction of the movable body on the side surface and is attached in a state where the pressing contact member has a smaller diameter than at a normal time, and the pressing contact member exerts a repulsive force from the side surface toward the outside in a state of being attached to the side surface of the movable body.

In another specific aspect of the driving device according to the present invention, the ring-shaped member has a shape obtained by cutting out part of a ring.

In another specific aspect of the driving device according to the present invention, a groove is formed in the side surface of the movable body and part of the pressing contact member fits into the groove.

In another specific aspect of the driving device of the present invention, the pressing contact member is formed of a plurality of spring members that each have a length direction that connects a first end portion thereof and a second end portion thereof that is on a side opposite to the first end portion, each of the spring members is configured such that a part thereof between the first end portion and the second end portion can be displaced in a direction that is orthogonal to the length direction, the first and second end portions of each spring member are fixed to the side surface of the movable body and the part of each spring member between the first and second end portions is bent so as to be urged in a direction away from the side surface of the movable body and an apex of the bent part press contacts the cavity of the elastic body.

In another specific aspect of the driving device according to the present invention, the plate-shaped elastic body and the piezoelectric element have different planar shapes.

In another specific aspect of the driving device according to the present invention, the piezoelectric element has a cavity in a center thereof and the cavity of the piezoelectric element is larger than the cavity of the elastic body and the piezoelectric element does not extend up to a peripheral edge of the cavity of the elastic body.

In another specific aspect of the driving device according to the present invention, the piezoelectric element is provided in a plurality.

In another specific aspect of the driving device according to the present invention, the other type of vibration includes a plurality of types of vibration.

In another specific aspect of the driving device according to the present invention, the piezoelectric element is provided on one main surface out of the first and second main surfaces of the elastic body.

In another specific aspect of the driving device according to the present invention, a driving pulse source is further provided that is electrically connected to the piezoelectric element and supplies driving pulses to the piezoelectric element such that the flexural vibration and the other type of vibration are realized with the same period.

According to another broader aspect of a driving device of the present invention, the driving device includes a plate-shaped driving unit that includes a plate-shaped elastic body having first and second main surfaces that oppose each other and a cavity that penetrates from the first main surface to the second main surface in the center of the elastic body, and a piezoelectric element that is joined to at least one of the main surfaces of the plate-shaped elastic body; and a movable body that is inserted into the cavity of the plate-shaped elastic body and that is moved in a direction that connects the first main surface and the second main surface of the plate-shaped elastic body as a result of the driving unit being driven. The plate-shaped driving unit is configured to vibrate with flexural vibration and at least one other type of vibration that is different to the flexural vibration or with a vibration of a coupled mode in which the flexural vibration and the at least one other type of vibration that is different to the flexural vibration are coupled with each other as a result of the piezoelectric element being driven. The other type of vibration or the vibration of the coupled mode has a vibration shape that realizes a movable state in which an inner wall of the cavity of the elastic body is frictionally engaged with the movable body such that the movable body can be made to move and a released state in which the inner wall of the cavity of the elastic body is separated from the movable body or is contacting the movable body with a frictional engagement force that is lower than that in the movable state. A driving pulse source is further provided that is electrically connected to the piezoelectric element and supplies driving pulses to the piezoelectric element such that the flexural vibration and the other type of vibration are generated or the vibration of the coupled mode is generated. The movable body is made to move by the flexural vibration and the other type of vibration of the driving unit or by the vibration of the coupled mode of the driving unit.

In another specific aspect of the driving device according to the present invention, the plate-shaped driving unit is configured to vibrate with the flexural vibration and the at least one other type of vibration that is different to the flexural vibration, and the driving pulse source supplies the driving pulses to the piezoelectric element such that the flexural vibration and the other type of vibration are realized with the same period and as a result the movable body is pitch fed by the flexural vibration and the other type of vibration of the driving unit.

In another specific aspect of the driving device according to the present invention, the driving unit is configured to vibrate with the vibration of the coupled mode and the driving pulse source supplies the driving pulses to the piezoelectric element such that the vibration of the coupled mode is generated.

In another specific aspect of the driving device according to the present invention, a planar shape of the movable body of the driving unit is a non-circular anisotropic shape.

In another specific aspect of the driving device according to the present invention, a planar shape of the cavity of the elastic body of the driving unit is a non-circular anisotropic shape.

With the driving device according to the present disclosure, by using flexural vibration and another type of vibration or vibration of a coupled mode excited in the plate-shaped driving unit, the movable body can be made to move stably and with certainty without the occurrence of backward movement and the movement speed of the movable body can be stabilized.

DETAILED DESCRIPTION OF EXEMPLARY EMBODIMENTS

Figure 1A:
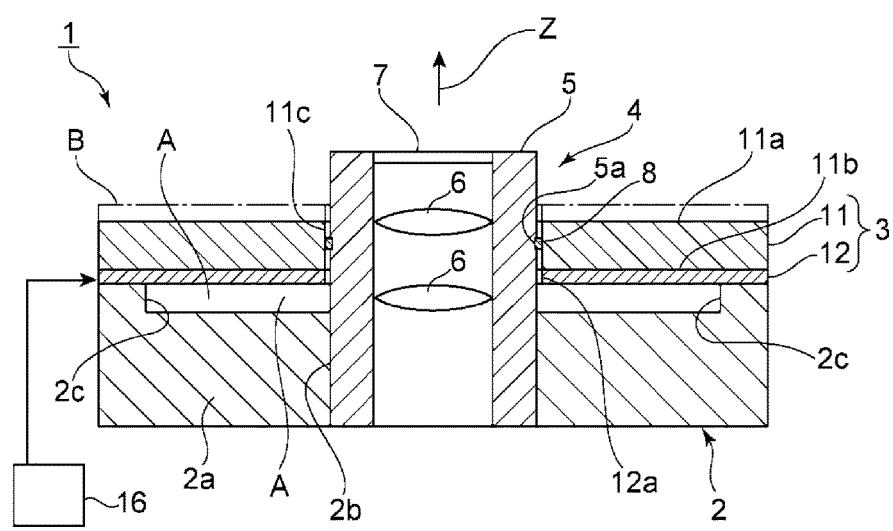
FIGS. 1(a) and 1(b) are a front sectional view of a driving device according to a first embodiment of the present invention and a plan view of a driving unit.
Figure 1B:
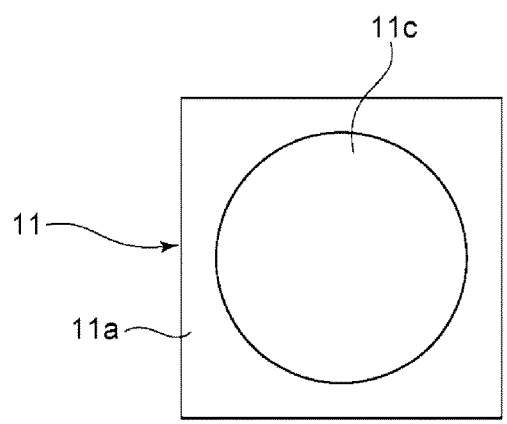

Hereafter, the present invention will be made clearer by describing specific embodiments of the present invention while referring to the drawings.

Figure 2:
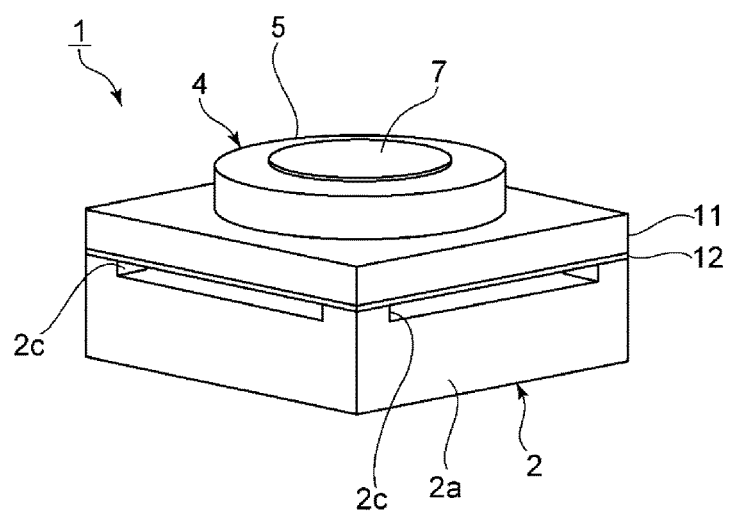
FIG. 2 is a perspective view illustrating the exterior of the driving device according to the first embodiment of the present invention.

FIG. 2 is a perspective view illustrating the exterior of a driving device according to a first embodiment of the present invention and FIG. 1(a) is a front sectional view of the same.

A driving device 1 of this embodiment includes a support 2. A driving unit 3 is fixed to the top of the support 2. In this embodiment, a movable body 4 is moved by the driving unit 3.

As illustrated in the perspective view in FIG. 2, the movable body 4 includes a cylindrical holder 5. A plurality of lenses 6 are arranged inside the holder 5. In addition, a transparent plate 7 is attached so as to seal the end surface of a cavity of the holder 5.

The driving device 1 of this embodiment causes the movable body 4, which includes the lenses 6, to move in an axial direction of the cylindrical holder 5. This driving device 1 can be suitably used as a lens driving device that includes camera lenses, for example. Arrow Z in FIG. 1(a) indicates the axial direction, and the movable body can be pitch fed in the axial direction Z by the driving device 1.

The material of the holder 5 of the movable body 4 is not particularly limited. The holder 5 can be formed of a metal, a ceramic or a synthetic resin, for example.

Figure 6:
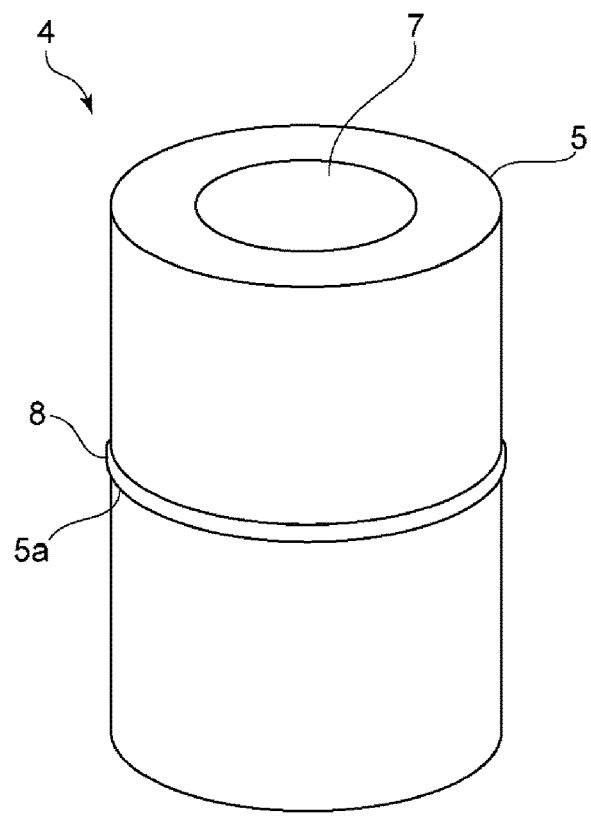
FIG. 6 is a perspective view illustrating a movable body used in the first embodiment of the present invention.
Figure 7:
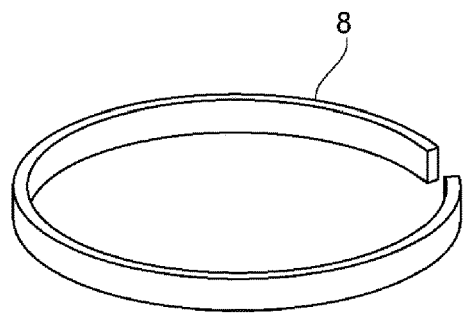
FIG. 7 is a perspective view illustrating a pressing contact member that is attached to the movable body in the first embodiment of the present invention.

As illustrated in FIG. 6, a groove 5a is formed so as to extend in a circumferential direction in a side surface of the holder 5. A ring-shaped pressing contact member 8 is attached so as to fit into the groove 5a. In this embodiment, as illustrated in FIG. 7, the pressing contact member 8 has a shape obtained by cutting out part of an annular ring shape. The pressing contact member 8 is composed of a metal. Furthermore, the pressing contact member 8 is attached to the holder 5 in a state where the diameter of the pressing contact member 8 has been made smaller than usual by closing the cut out portion. Consequently, a force acts in a direction in which the cut-out portion opens, and the pressing contact member 8 applies an elastic force in the direction of a larger diameter.

In this embodiment, an outer circumferential surface of the pressing contact member 8 frictionally engages with an inner wall of a cavity 11c of an elastic body 11 of the driving unit 3, which will be described later.

Figure 8:
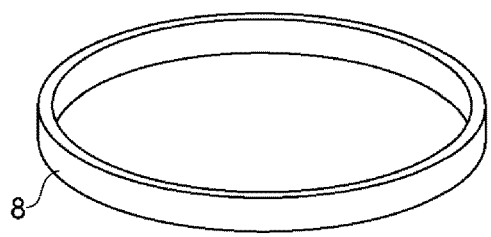
FIG. 8 is a perspective view illustrating a modification of the pressing contact member.

As illustrated in FIG. 8, a pressing contact member 8 having a closed ring-shape may be used. As an example of such a pressing contact member 8 having a closed ring shape, a cylindrical pressing contact member 8 having a circular cylindrical shape or a rectangular cylindrical shape can be given. In this case as well, it is sufficient that the pressing contact member 8 be inserted into the cylindrical holder 5 from the outside and fixed in place.

Figure 5:
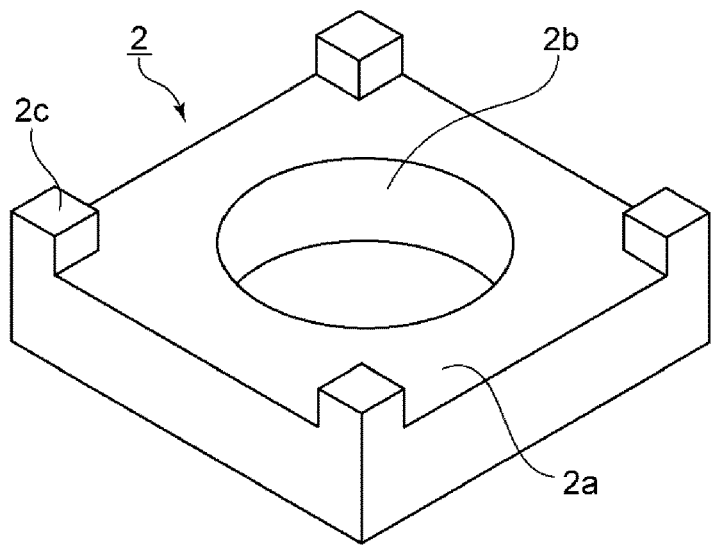
FIG. 5 is a perspective view illustrating a support used in the first embodiment of the present invention.

The support 2 is composed of a metal, a ceramic or a synthetic resin. As illustrated in FIG. 5, the support 2 includes a rectangular-plate-shaped plate 2a. A through hole 2b is provided in the center of the plate 2a. As illustrated in FIG. 1(a), the through hole 2b is a part through which the movable body 4 is inserted.

Supporting protrusions 2c that protrude upward are provided at corner portions of the plate 2a. The driving unit 3 is fixed to upper surfaces of the plurality of supporting protrusions 2c. Therefore, a space A is provided between the plate 2a and the driving unit 3, as illustrated in FIG. 1(a). Since the space A is provided, the vibration, which will be described later, of the driving unit 3 is unlikely to be obstructed.

The driving unit 3 includes a plate-shaped elastic body 11 and a piezoelectric element 12 that is joined to a lower surface of the plate-shaped elastic body 11. The plate-shaped elastic body 11 is composed of a metal plate such as a stainless steel plate in this embodiment. The elastic body 11 may be formed of a plate-shaped elastic material other than a metal plate.

The piezoelectric element 12 is joined to the lower surface of the elastic body 11, but a piezoelectric element may be joined to the upper surface of the elastic body 11 as illustrated by an alternate long and short dash line B in FIG. 1(a). In addition, a piezoelectric element 12 may be joined to both the lower surface and the upper surface of the elastic body 11.

According to one aspect, the piezoelectric element 12 be formed preferably on only one of the upper surface and the lower surface of the elastic body 11. The cost can be reduced in such as case. In addition, area expansion vibration, which will be described later, is utilized as another type of vibration in this embodiment, and area expansion vibration is easily excited when the piezoelectric element 12 is provided on only one surface of the elastic body 11.

Although the piezoelectric element 12 is provided on the lower surface of the elastic body 11 in this embodiment, according to another embodiment, the piezoelectric element 12 can be provided on only the upper surface of the elastic body 11 in order to cause the movable body 4 to move upward. However, it is advantageous that the piezoelectric element 12 is arranged on the support 2 side of the elastic body 11 as in this embodiment in order to prevent the outside of the piezoelectric element 12 from being contacted.

The plate-shaped elastic body 11 has an upper surface 11a, which is a first main surface, and a lower surface 11b, which is a second main surface. In addition, the elastic body 11 has a cavity 11c in the center thereof that penetrates from the upper surface 11a to the lower surface 11b. The cavity 11c is a part into which the movable body 4 is inserted and the inner wall of the cavity 11c is frictionally engaged with the outer circumferential surface of the pressing contact member 8 attached to the movable body 4, which will be described later. The piezoelectric element 12 also has a through hole 12a.

Figure 3A:
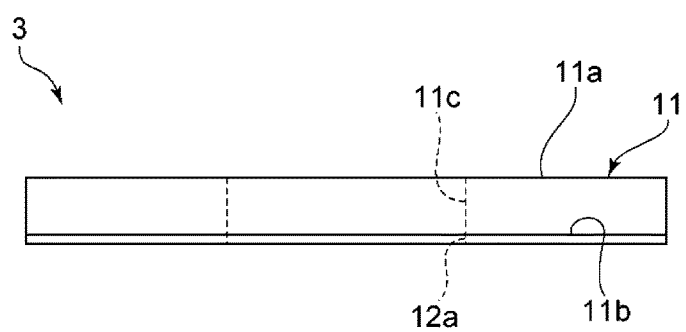
FIG. 3(a) is a front view of the driving unit used in the first embodiment of the present invention and FIG. 3(b) is a sectional view illustrating a piezoelectric element in detail.
Figure 3B:
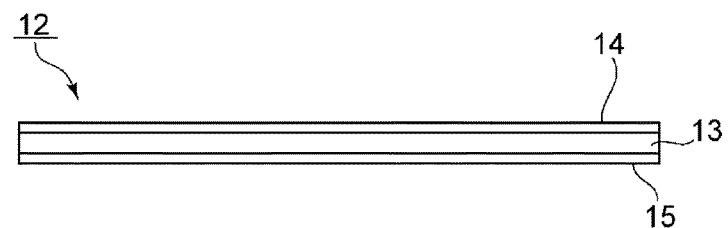

The details of the piezoelectric element 12 are not illustrated in FIG. 1(a), FIG. 2 and FIG. 3(a), and, in the exemplary embodiment, electrodes 14 and 15 are formed on the two surfaces of a piezoelectric body 13, as illustrated in FIG. 3(b). The piezoelectric element 12 is joined to the elastic body 11 from the electrode 14 side. In addition, the electrode 14 may be omitted and the elastic body 11 may be used as one electrode in the embodiment where the elastic body 11 is a metal plate.

A known multilayer piezoelectric element of the related art may be used instead of a configuration using a single-layer piezoelectric body 13. That is, a multilayer piezoelectric element having a plurality of piezoelectric layers and a plurality of inner electrodes may be used.

Figure 4:
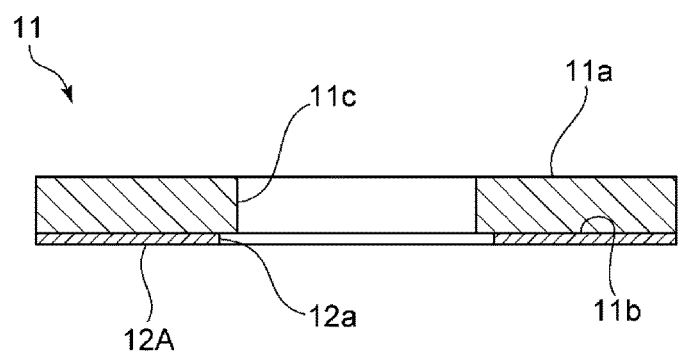
FIG. 4 is a front sectional view illustrating a modification of the driving unit used in the present invention.

The planar shape of the piezoelectric element 12 is the same as the planar shape of the elastic body 11. However, the planar shape of the piezoelectric element 12 may be different to the planar shape of the elastic body 11. According to the exemplary embodiment, the diameter of the through hole 12a of a piezoelectric element 12A is preferably larger than the diameter of the cavity 11c of the elastic body 11 as in a modification illustrated in FIG. 4. In this case, the inner peripheral surface of the through hole 12a of the piezoelectric element 12A is positioned closer to the outside than the edge of the cavity of the cavity 11c. Therefore, contact between the piezoelectric element 12A and the movable body 4 can be prevented with more certainty.

A suitable piezoelectric ceramic such as a PZT-based ceramic can be used as the piezoelectric ceramic that forms the piezoelectric body 13. The electrodes 14 and 15 can be formed of a suitable metal or alloy.

In this embodiment, the piezoelectric element 12 is excited by supplying a pulsed driving electric field to the piezoelectric element 12. Thus, flexural vibration and another type of vibration are generated in the driving unit 3 and the flexural vibration and the other type of vibration are utilized.

That is, the driving unit 3, in which the piezoelectric element 12 and the elastic body 11 are adhered to each other, vibrates when the piezoelectric element 12 is excited. In this driving unit 3, flexural vibration is generated in which the center of the main surfaces of the driving unit 3 are displaced up and down. At the same time, area expansion vibration in which the diameter of the cavity 11c becomes larger and smaller is also excited. In this embodiment, flexural vibration and this area expansion vibration are utilized.

In this embodiment, flexural vibration and area expansion vibration of the same period are excited when driving pulses are supplied from a driving pulse source 16 schematically illustrated in FIG. 1(a) to the piezoelectric element 12.

In order to generate the flexural vibration and the area expansion vibration with the same period as described above, the resonant frequencies of both types of vibration should be adjusted to be the same or the resonant frequencies of both types of vibration should be adjusted to a specific frequency interval in accordance with the driving pulses. This frequency interval can be adjusted by changing the material, the thickness and the dimensions of the planar shape of the elastic body 11.

Figure 9:
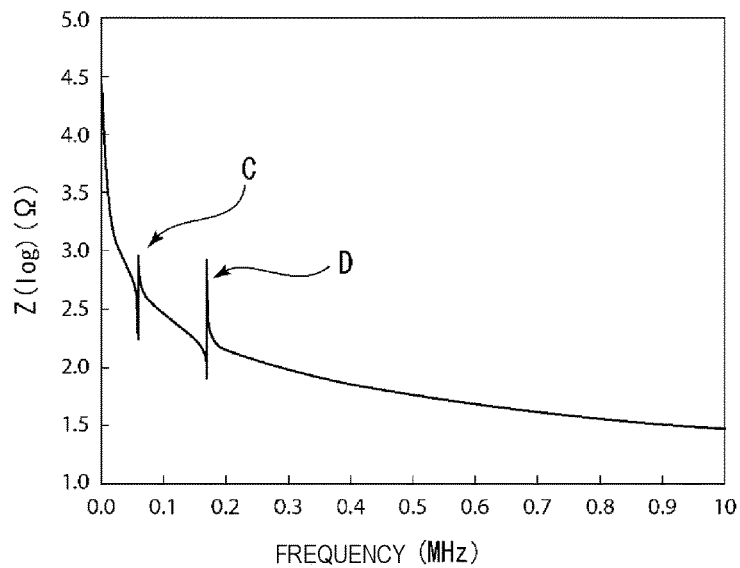
FIG. 9 illustrates resonance characteristics of the driving unit in the first embodiment of the present invention.

FIG. 9 illustrates the resonance characteristics of the driving unit 3 of this embodiment. Here, the resonance of the flexural vibration appears at a position indicated by arrow C and the resonance of the area expansion vibration appears at a higher position indicated by arrow D. The resonant frequency of the flexural vibration is 0.059 MHz and the resonant frequency of the area expansion vibration is 0.169 MHz. In this case, the flexural vibration and the area expansion vibration can be generated with the same period by a driving pulse signal, which will be described later. Therefore, the driving unit 3 can be easily driven so that the periods of the flexural vibration and the area expansion vibration are the same.

A pitch feeding operation of the movable body 4 performed by the driving device 1 of this embodiment will be described while referring to FIGS. 10 and 11.

As described above, the flexural vibration and the area expansion vibration are used. Here, the area expansion vibration has a vibration shape that realizes a movable state in which the inner wall of the cavity 11c of the elastic body 11 is frictionally engaged with the movable body 4 and a released state in which the inner wall of the cavity 11c of the elastic body 11 is separated from the movable body 4 or is contacting the movable body 4 with a frictional engagement force that is lower than that in the movable state.

Figure 10A:
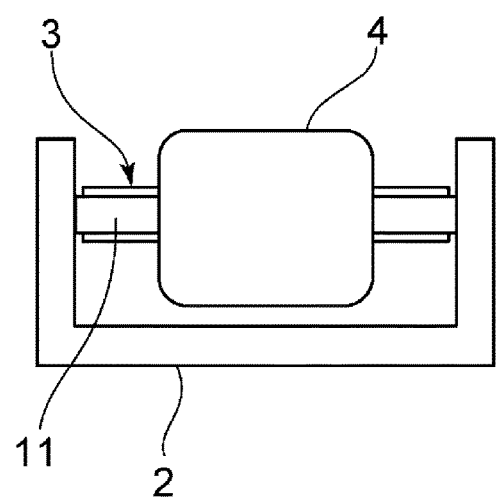
FIG. 10(a) and FIG. 10(b) are schematic diagrams illustrating an initial state and a state in which the movable body is gripped in the first embodiment of the present invention.
Figure 10B:
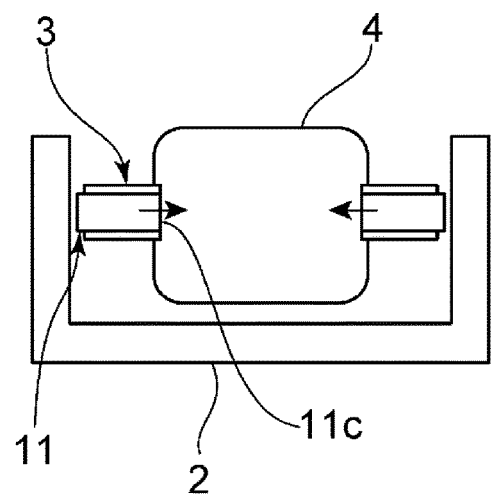
Figure 11A:
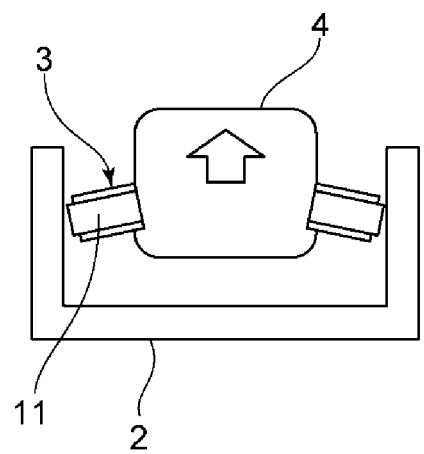
FIG. 11(a) and FIG. 11(b) are schematic diagrams for explaining a state in which pitch feeding is achieved and a process in which a plate-shaped elastic body is withdrawn from a movable body in the driving device of the first embodiment of the present invention.

FIG. 10(a) illustrates an initial state. When pitch feeding is performed, first, as illustrated in FIG. 10(b), the elastic body 11 is displaced by area expansion vibration such that the cavity 11c becomes narrower as indicated by the arrows. As a result, the movable state, that is, a gripped state in which the movable body 4 is gripped by the elastic body 11 is realized. In this state, since the driving unit 3 is displaced with the same phase by the flexural vibration, the driving unit 3 is displaced and the movable body 4 is moved upward, as illustrated in FIG. 11(a).

Next, in the area expansion vibration, the elastic body 11 is displaced so as to enter the released state mentioned above, the released state being a state in which the inner wall of the cavity 11c of the elastic body 11 is separated from the movable body 4 or is contacting the movable body 4 with a frictional engagement force that is lower than that in the movable state. At the same time, in this released state, the region in the vicinity of the cavity 11c of the elastic body 11 in the driving unit 3 moves downward due to the flexural vibration as illustrated in FIG. 11(b).

Figure 11B:
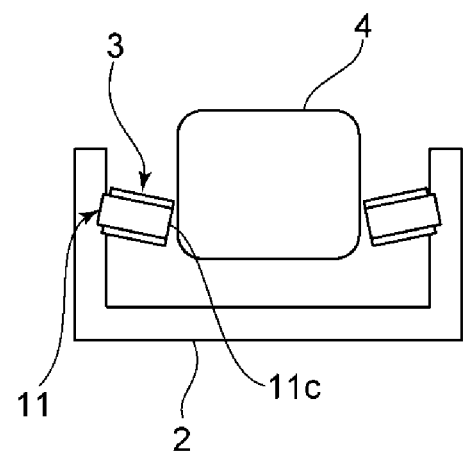

After that, due to the next driving pulse, the movable body 4 is moved upward once again as illustrated in FIG. 11(b) with the next gripped state due to displacement caused by the flexural vibration. The movable body 4 is pitch fed upward in this way.

Figure 12:
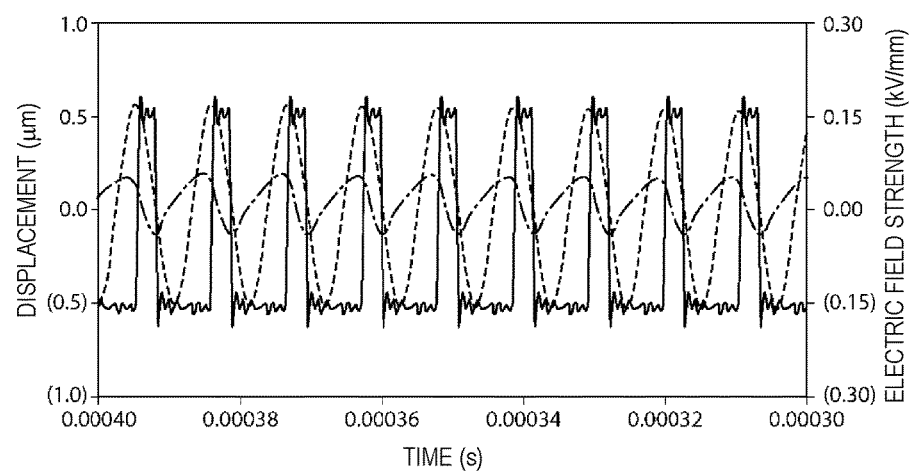
FIG. 12 illustrates the relationship between a driving pulse signal that is applied when driving is performed and flexural vibration and area expansion vibration of a driving unit in the driving device of the first embodiment of the present invention.

In this embodiment, a driving pulse signal is supplied from a driving pulse source such that the period of the flexural vibration and the period of the area expansion vibration are the same. This will be explained in more detail while referring to FIGS. 12 and 13. FIG. 12 illustrates the relationship between a driving pulse signal, flexural vibration and area expansion vibration when pitch feeding is performed. A solid line represents the driving pulse signal, a dashed line represents area expansion vibration displacement and an alternate long and short dash line represents flexural vibration displacement. The electric field strength of the driving pulse signal changes with a period that is indicated by the solid line. In accordance with this, the flexural vibration and the area expansion vibration are excited and, as is clear from FIG. 12, the period of the flexural vibration and the period of the area expansion vibration are substantially the same.

Figure 13:
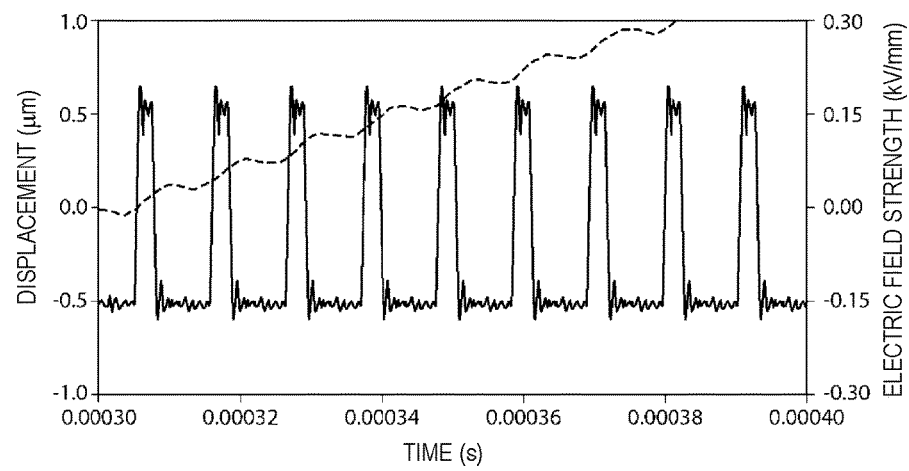
FIG. 13 illustrates the relationship between an applied driving pulse signal and the displacement of a movable body at the time of operation of the first embodiment of the present invention.

FIG. 13 illustrates displacement, that is, the pitch fed state, of the movable body 4 when the driving pulse signal is supplied to the driving unit 3. A solid line represents the driving pulse signal and a dashed line represents displacement of the movable body.

It is clear from FIG. 13 that the movable body 4 can be pitch fed with certainty by supplying the driving pulses to the driving unit 3. In particular, in this embodiment, when the movable body 4 is pitch fed, the inner wall of the cavity 11c of the elastic body 11 moves backward, that is, downward with respect to the movable body 4 in the released state. Therefore, there is hardly any risk of the movable body 4 moving backward when being pitch fed. Therefore, the movable body 4 can be stably pitch fed upward. Furthermore, as is clear from the dashed line in FIG. 13, the movement speed in each one pitch when pitch feeding is being performed is substantially constant and the driving speed can also be stabilized. This is because not only flexural vibration, which is for moving the movable body 4 forward, but also area expansion vibration, which creates the gripped state and the released state, are utilized and the periods of the flexural vibration and the area expansion vibration are the same.

Figure 25:
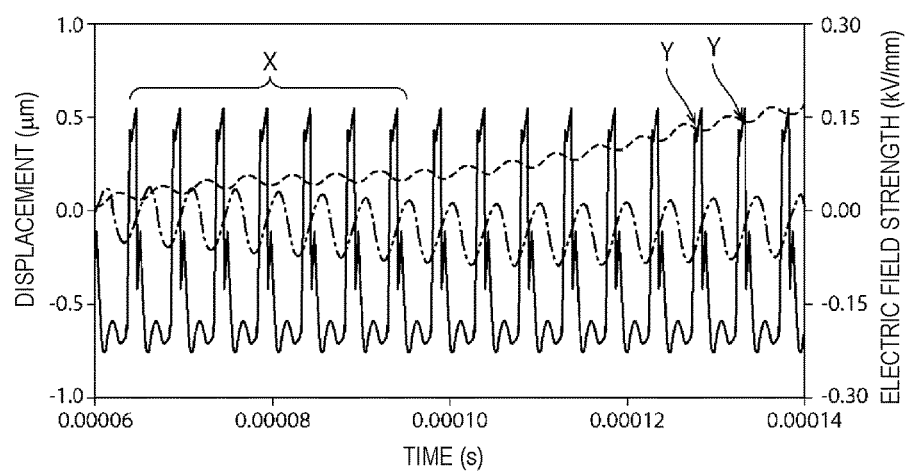
FIG. 25 illustrates the relationship between an applied driving pulse signal, flexural vibration displacement and displacement of a movable body at the time of operation of a comparative example.

For comparison, a driving device was prepared that had the same configuration as the above embodiment except that area expansion vibration was not used and only flexural vibration was used. Operation of this comparative example is illustrated in FIG. 25. In FIG. 25, a solid line represents a driving pulse signal, an alternate long and short dash line represents the waveform of flexural vibration and a dashed line represents displacement of the movable body. As is clear from the dashed line in FIG. 25, in the comparative example, there is a period X in which the movable body does not move very much directly after the displacement is started. Therefore, it is clear that the responsiveness after driving is poor. In addition, as indicated by an arrow Y, a backward movement phenomenon is seen for every pitch at the point where pitch feeding begins.

In contrast, as is clear from the dashed line in FIG. 13, the movable body 4 can be moved without causing this backward movement in this embodiment. Furthermore, the movable body 4 can be quickly made to move stably in the axial direction immediately after driving is performed.

In the first embodiment, the movable body 4 can be made to retreat by inverting the duty of the driving pulses.

Figure 14:
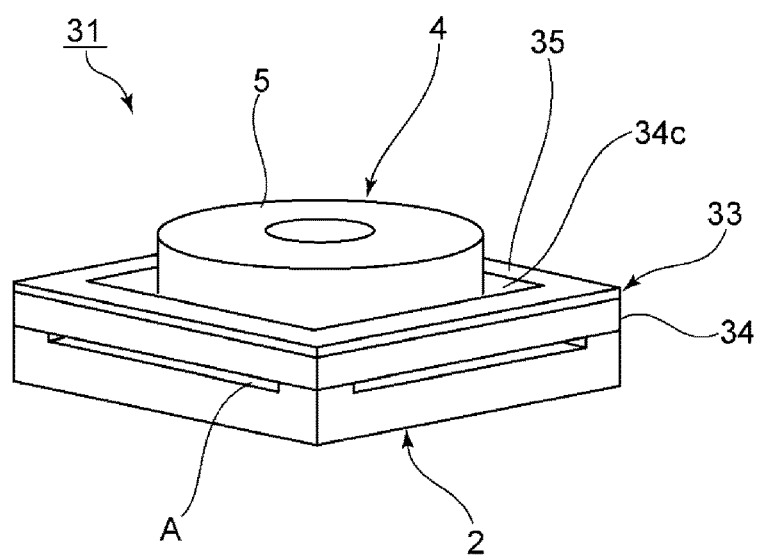
FIG. 14 is a perspective view illustrating the exterior of a driving device according to a second embodiment of the present invention.
Figure 15:
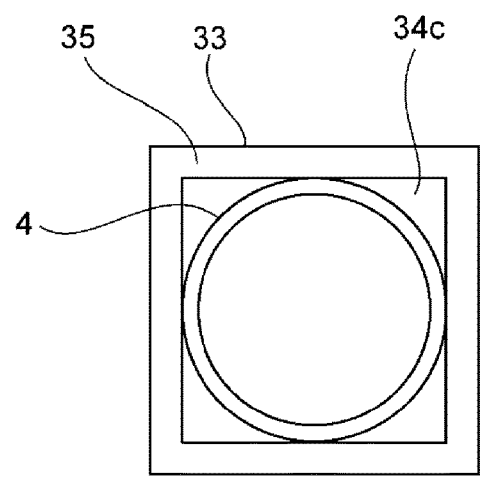
FIG. 15 is a schematic plan view of a driving unit in the second embodiment of the present invention.

FIG. 14 is a perspective view of a driving device according to a second embodiment of the present invention and FIG. 15 is a schematic plan view illustrating the relationship between a driving unit and a movable body used in the second embodiment.

As illustrated in FIG. 14, a driving device 31 includes a support 2 and a driving unit 33 that is fixed to the top of the support 2. As illustrated in FIG. 15, the driving unit 33 has a rectangular frame shape in plan view. In the driving unit 33, a piezoelectric element 35 is joined to an upper surface of the rectangular frame-shaped elastic body 34. The piezoelectric element 35 also has a rectangular frame shape.

In addition, a movable body 4 is arranged inside a cavity 34c of the rectangular frame-shaped elastic body 34. The movable body 4 has the same configuration as that of the first embodiment. An outer circumferential surface of the movable body 4 is frictionally engaged with the centers of the four inner walls of the elastic body 34.

The piezoelectric element 35 is excited by applying an alternating electric field to the piezoelectric element 35. Then, the driving unit 33 in which the piezoelectric element 35 is affixed to the elastic body 34 vibrates with the flexural vibration and the area expansion vibration similarly to as in the first embodiment. In this embodiment as well, the movable body 4 can be made to move forward by the flexural vibration and a gripped state in which the movable body 4 is gripped and a released state described above can be realized by the area expansion vibration, similarly to as in the first embodiment.

Although illustration thereof is omitted from FIGS. 14 and 15, the pressing contact member 8 used in the first embodiment may also be employed in this embodiment.

In this embodiment, the resonant frequency of the flexural vibration and the resonant frequency of the area expansion vibration can be arbitrarily adjusted. This is because the rectangular frame-shaped elastic body 11 and the rectangular frame-shaped piezoelectric element 35 are used and therefore the resonant frequency of flexural vibration and the resonant frequency of area expansion vibration can be easily adjusted by adjusting the dimensions of these rectangular frame shapes. For example, the resonant frequency of area expansion vibration can be easily adjusted by adjusting the dimensions of the planar shape of the elastic body. In addition, the resonant frequency of flexural vibration can be easily adjusted by adjusting the dimensions and thickness of the frame-shaped part of the elastic body. For example, by using a stainless steel body having an outer shape of 8.5 mm×8.5 mm×a thickness of 1.2 mm and a frame-shaped-part width of 1.0 mm, the resonant frequencies of flexural vibration and area expansion vibration can be easily adjusted to around 85 kHz.

In the above-described first embodiment, the elastic body 11 has a rectangular outer shape in plan view and the cavity 11c has a circular shape in plan view. In this case, since the cavity has an isotropic shape, the resonant frequencies of the flexural vibration and the area expansion vibration can be adjusted by adjusting the material, the thickness and the dimensions of the planar shape of the elastic body. In contrast, in the second embodiment, the elastic body 34 has a rectangular outer shape in plan view and the cavity 34c has a rectangular shape in plan view. In this case, the resonant frequencies of the area expansion vibration and the flexural vibration can be adjusted even more easily by changing the material, the thickness and the dimensions of the planar shape of the elastic body as described above. When the elastic body has a circular outer shape in plan view and the cavity has a circular shape in plan view, it is not possible to arbitrarily adjust the resonant frequencies of the flexural vibration and the area expansion vibration even if the material, the thickness and the dimensions of the planar shape of the elastic body are adjusted.

Therefore, as described above, according to an exemplary embodiment, the outer shape of the elastic body in plan view and the shape of the cavity in plan view are preferably non-circular. Therefore, the frequency interval between the resonant frequency of the area expansion vibration and the resonant frequency of the flexural vibration can be easily adjusted so that the vibrations are driven with the same period by the driving pulse signal.

In the second embodiment, these resonant frequencies can be easily adjusted such that the flexural vibration and the area expansion vibration are generated with the same period by the driving pulse signal. Therefore, the flexural vibration and the area expansion vibration can be generated with the same period with even higher accuracy. Consequently, compared with the first embodiment, the movable body 4 can be pitch fed with more certainty using a lower driving voltage. In addition, the stability of the movement speed when pitch feeding is performed can be made even higher.

In the first and second embodiments, the flexural vibration and the area expansion vibration, which is the other type of vibration, are utilized. In the present invention, the other type of vibration may be a type of vibration other than area expansion vibration.

Figure 16:
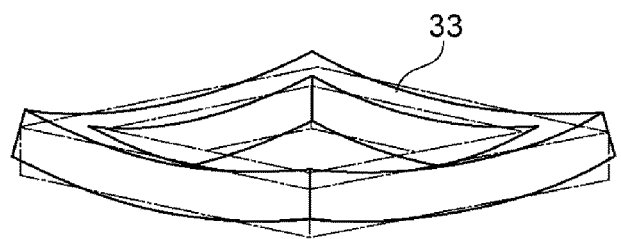
FIG. 16 is a schematic perspective view illustrating the vibration shape of a bending mode in a driving device according to a third embodiment of the present invention.
Figure 17:
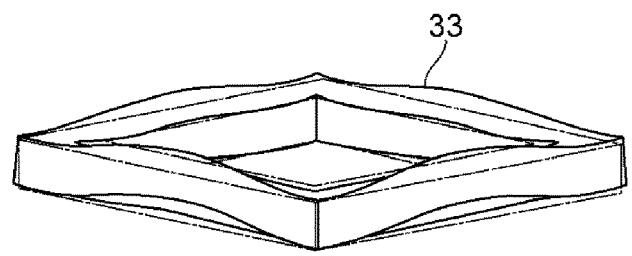
FIG. 17 is a schematic perspective view for explaining the vibration shape of an undulating vibration mode of the driving unit in the third embodiment of the present invention.
Figure 18:
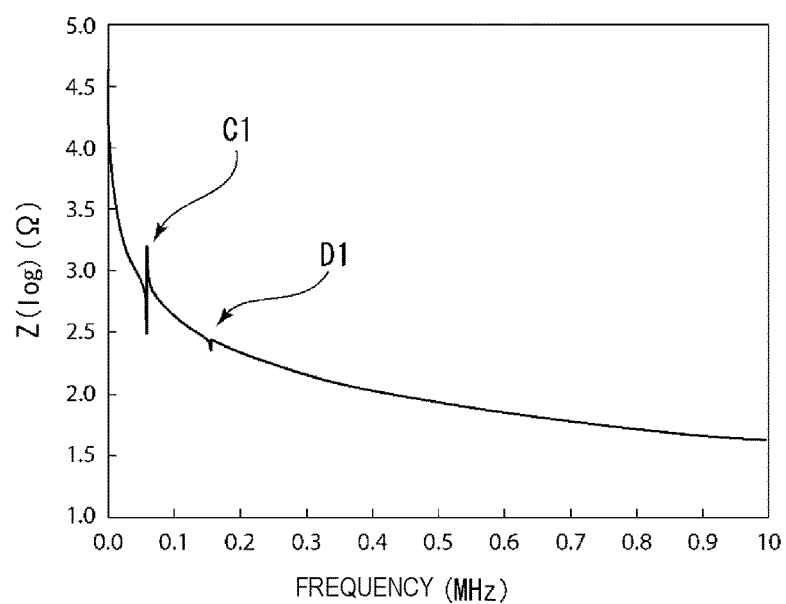
FIG. 18 illustrates impedance characteristics of the driving unit in the third embodiment of the present invention.

Referring to FIGS. 16 to 18, a driving device in which the other type of vibration is undulating vibration will be described as a third embodiment.

In the third embodiment, a rectangular-frame-shaped driving unit 33 is used, similarly to as in the second embodiment. The driving unit 33 has the same configuration as that of the second embodiment. In this embodiment, the driving unit 33 vibrates in a bending mode as illustrated by the vibration shape in FIG. 16. At the same time, the driving unit 33 also vibrates in undulating vibration as illustrated by the vibration shape in FIG. 17. In this embodiment, the interval between the resonant frequencies of the two types of vibration is adjusted such that the flexural vibration and the area expansion vibration are generated with the same period when driving is performed with a certain driving pulse signal. Therefore, the driving unit 33 is designed in this embodiment as well.

FIG. 18 illustrates the impedance characteristics of the driving unit 33 of the third embodiment. A response of the bending mode appears at a position indicated by arrow C1. In addition, a response of the undulating vibration appears at a position indicated by arrow D1. The two resonant frequencies can be easily adjusted by adjusting the dimensions of the elastic body and the dimensions of the piezoelectric element of the driving unit 33, similarly to as in the second embodiment.

In addition, in the first to third embodiments, one type of vibration such as area expansion vibration or undulating vibration is used as the other vibration mode, but a plurality of types of vibration may be instead used as the other type of vibration.

Furthermore, the other type of vibration may be a vibration in the width direction or a vibration in the length direction.

Figure 19:
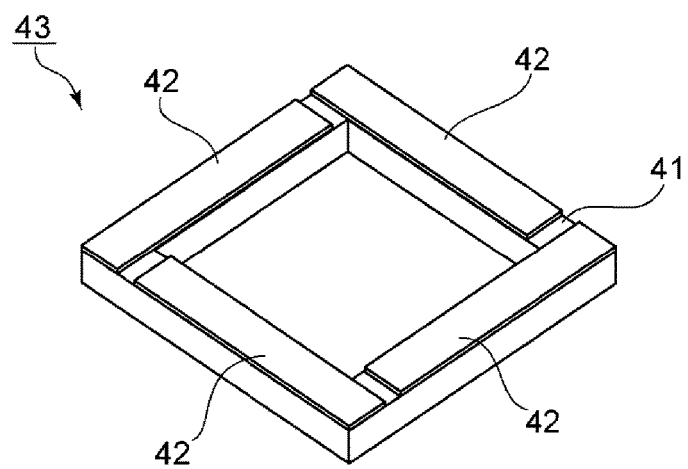
FIG. 19 is a perspective view illustrating a driving unit used in a driving device according to a fourth embodiment of the present invention.

In addition, one piezoelectric element 12 is affixed to one surface of the elastic body 11 in the first embodiment, but a plurality of piezoelectric elements 42 may be joined to an elastic body 41 as in a fourth embodiment illustrated in FIG. 19. In this embodiment, a rectangular-frame-shaped elastic body 41 is used as a plate-shaped elastic body. A plurality of piezoelectric elements 42 are joined to one surface of the elastic body 41. Each piezoelectric element 42 is joined to an upper surface of the elastic body 41 along one side of the rectangular frame shape.

The piezoelectric elements 42 are excited by applying an alternating electric field to the piezoelectric elements 42. As a result, the driving unit 43 generates flexural vibration and area expansion vibration.

Figure 20:
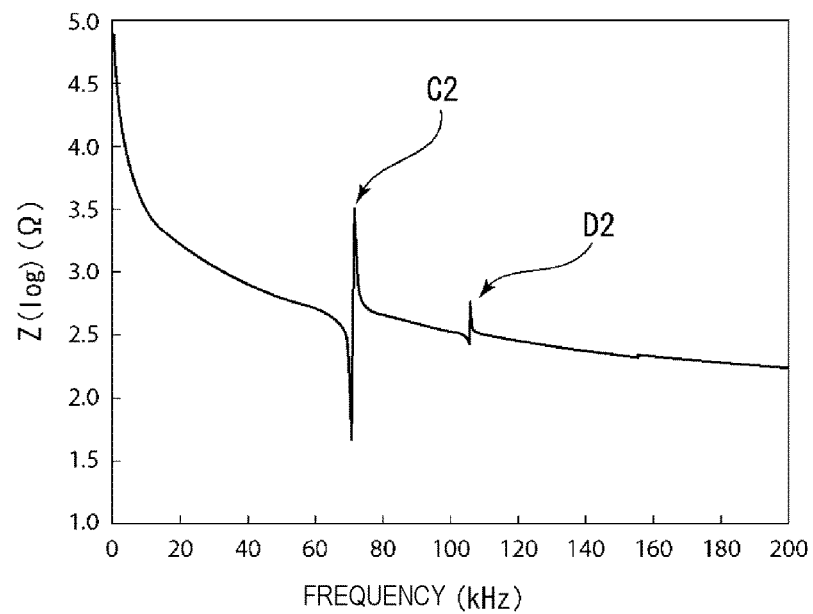
FIG. 20 illustrates impedance characteristics of a driving unit in a driving device of the fourth embodiment of the present invention.

FIG. 20 illustrates the impedance characteristics of the driving unit 43. A response of the flexural vibration appears at a position indicated by arrow C2 and a response of the area expansion vibration appears at a position indicated by arrow D2. In this embodiment as well, the interval between the resonant frequencies of the two vibrations is selected such that the flexural vibration and the area expansion vibration are generated with the same period. Therefore, the movable body can be pitch fed accurately. Thus, a plurality of piezoelectric elements may be joined to one surface or both surfaces of the elastic body.

Figure 21:
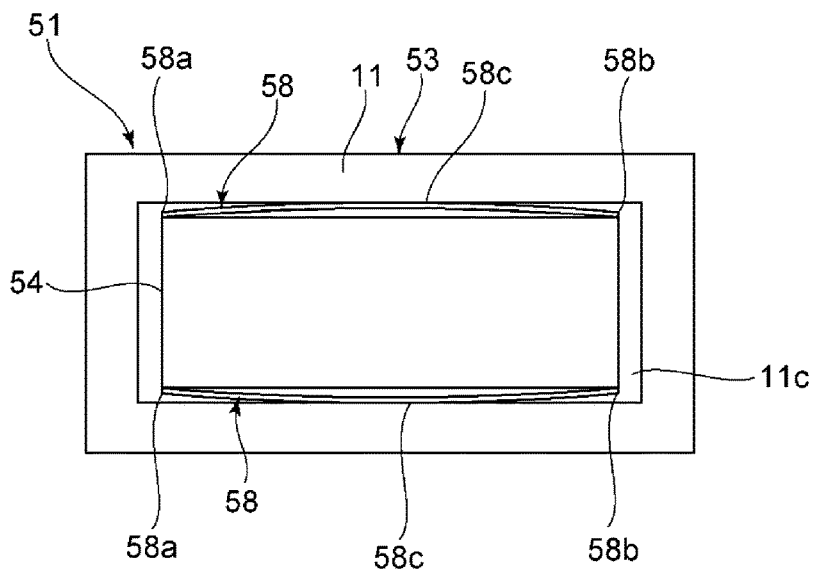
FIG. 21 is a plan view of a driving device according to a fifth embodiment of the present invention.
Figure 22:
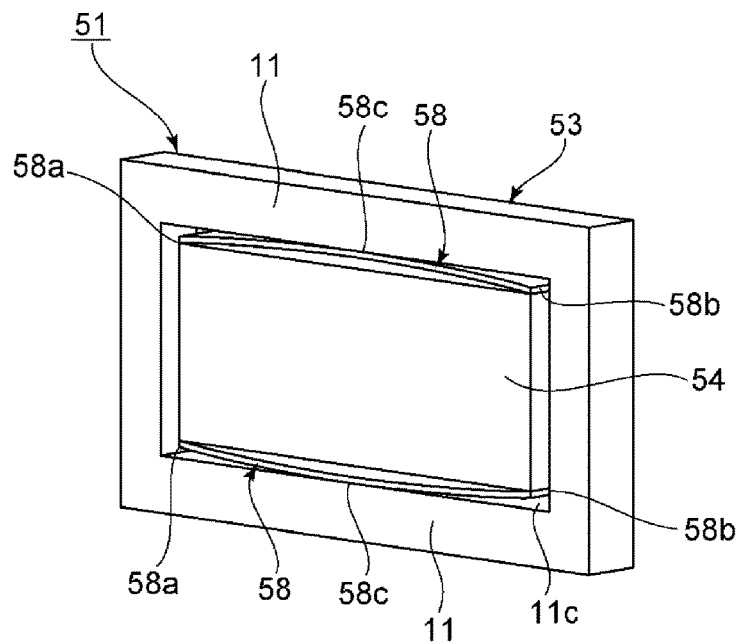
FIG. 22 is a perspective view seen from a bottom surface side of the driving device of the fifth embodiment of the present invention.

FIG. 21 is a plan view of a driving device according to a fifth embodiment of the present invention and FIG. 22 is a perspective view seen from a bottom surface side.

A driving device 51 includes a driving unit 53. In this embodiment, the driving unit 53 has a rectangular-frame-like planar shape. It should be pointed out that just the outline of the driving unit 53 including the elastic body 11 is illustrated in a schematic manner in FIGS. 21 and 22. That is, only the elastic body 11, a movable body 54 and pressing contact members 58 are illustrated. The piezoelectric element and so forth have the same configurations as those in the first to fourth embodiments described above.

In this embodiment, the elastic body 11 has a rectangular outer shape in plan view and the cavity 11c also has a rectangular shape in plan view. The movable body 54 is arranged inside the cavity 11c of the elastic body 11. The movable body 54 has a rectangular parallelepiped shape, more specifically, a rectangular plate shape. Thus, in the present invention, the shape of the movable body is not limited to a cylindrical shape or a columnar shape and can have any of various shapes such as a rectangular parallelepiped shape.

Figure 23:
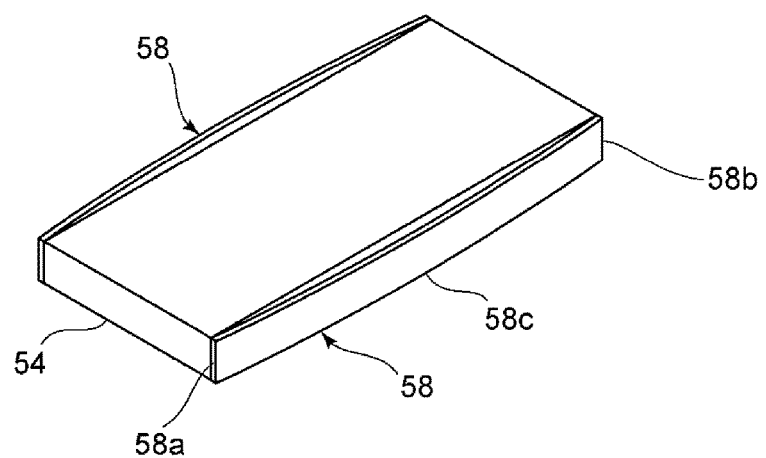
FIG. 23 is a perspective view illustrating a movable body and pressing contact members used in the fifth embodiment of the present invention.
Figure 24:
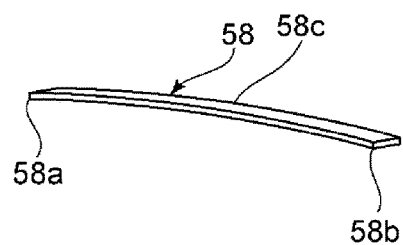
FIG. 24 is a perspective view illustrating a pressing contact member used in the fifth embodiment of the present invention.

As illustrated in FIG. 23, in this embodiment, the pressing contact members 58 are respectively fixed to a pair of opposing side surfaces of the movable body 54. As illustrated in FIG. 24, each pressing contact member 58 is composed of a metal and has a first end portion 58a and a second end portion 58b. The pressing contact members 58 are each fixed to the respective side surface of the movable body 54 at the first end portion 58a and the second end portion 58b. The pressing contact members 58 each have a length direction that connects the first end portion 58a and the second end portion 58b. As illustrated in FIG. 21, a central portion of each pressing contact member 58 in the length direction is energized so as to be separated from the side surface of the movable body 54. The pressing contact members 58 have the above-described shape and act as flat springs.

A repelling portion 58c between the first end portion 58a and the second end portion 58b contacts, that is, press contacts the inner surface of the cavity 11c. Thus, in this embodiment, flat-spring pressing contact members 58 may be used. Not limited to a flat spring, a wire spring may be used where a straight-line-shaped elastic member is formed so as to have an elastic force in a central portion thereof.

Figure 26:
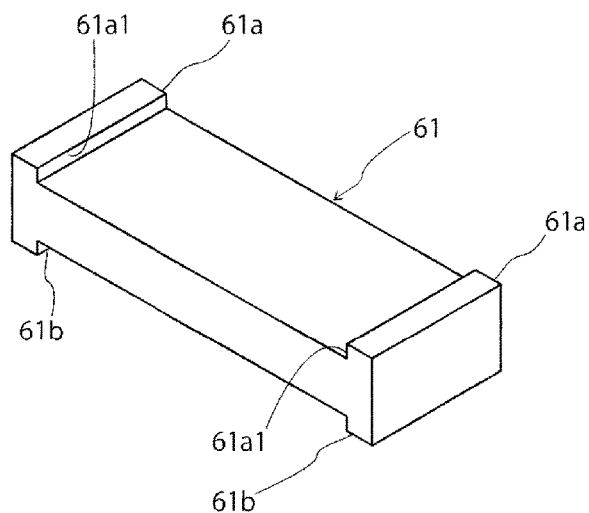
FIG. 26 is a perspective view of a movable body used in a sixth embodiment of the present invention.

FIG. 26 is a perspective view of a movable body 61 used in a sixth embodiment of the present invention. The movable body 61 has a substantially rectangular plate-like shape. Protruding portions 61a are provided on one main surface of the movable body 61 at the two ends of the movable body 61 in the length direction. Protruding portions 61b are also provided on the other main surface at the two ends in the length direction.

Figure 27:
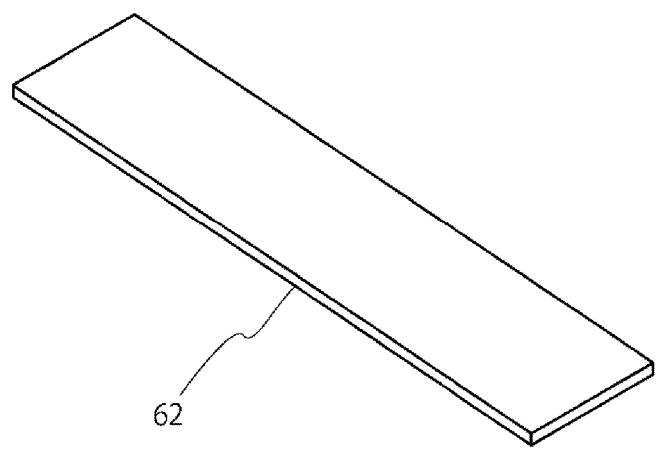
FIG. 27 is a perspective view illustrating a pressing contact member used in the sixth embodiment of the present invention.

FIG. 27 is a perspective view illustrating a pressing contact member 62 that is attached to the movable body in this embodiment. The pressing contact member 62 is composed of a metal plate and acts as flat spring as a result of being bent.

The length of the pressing contact member 62 is longer than the distance between the protruding portions 61a.

Figure 28:
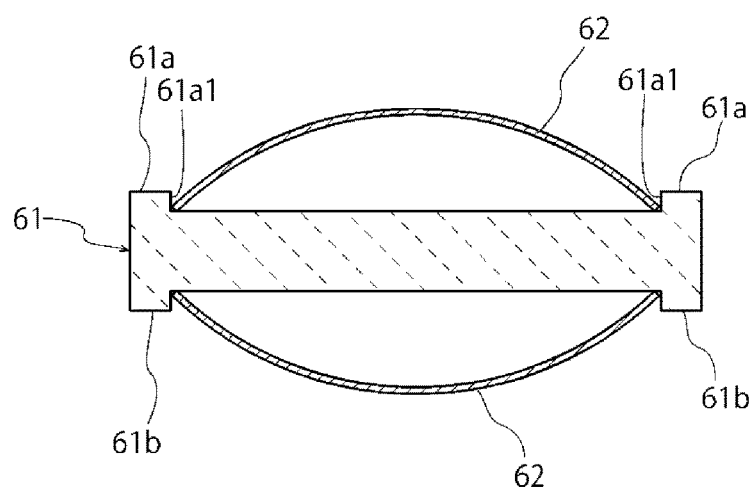
FIG. 28 is a front sectional view of a structure in which pressing contact members are attached to a movable body in the sixth embodiment of the present invention.

As illustrated in FIG. 28, the pressing contact member 62 is bent and attached between the protruding portions 61a. Thus, the pressing contact member 62 acts as a flat spring. A pressing contact member 62 composed of a flat spring is also similarly attached between the protruding portions 61b.

Such a structure in which the pressing contact members 62 are attached to the movable body 61 can be used together with the elastic body 11 having a rectangular-frame-shaped cavity used in the fifth embodiment, for example.

Figure 29:
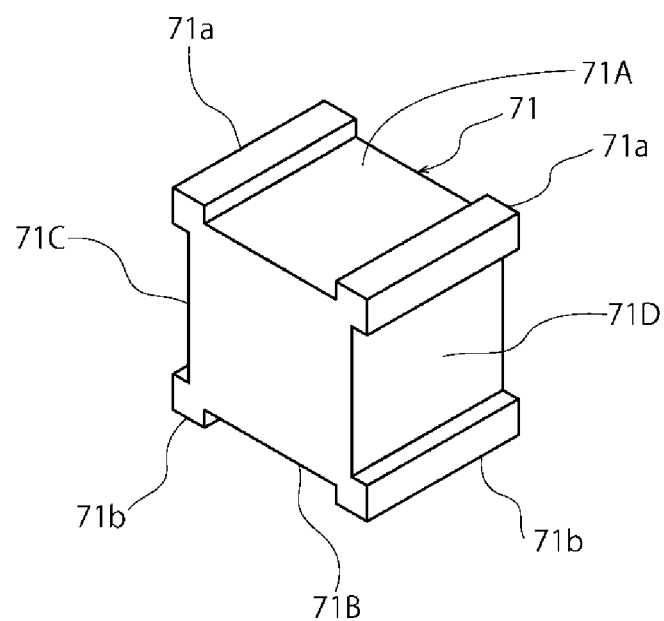
FIG. 29 is a perspective view illustrating a movable body used in a seventh embodiment of the present invention.

In addition, FIG. 29 is a perspective view of a movable body used in a seventh embodiment of the present invention. A movable body 71 has a rectangular parallelepiped shape. That is, the planar shape thereof is substantially square. Protruding portions 71a are provided on an upper surface 71A of the movable body 71 along edges of side surfaces 71C and 71D of the movable body 71. The protruding portions 71a protrude upward from the upper surface 71A. In addition, the protruding portions 71a protrude toward the outside from the side surfaces 71C and 71D. Similarly, protruding portions 71b are provided on a lower surface 71B along edges of the lower surface 71B and the side surfaces 71C and 71D.

A movable body 71 having square planar shape, such as the movable body 71 illustrated in FIG. 29, may be used. Here, the pressing contact member 62 illustrated in FIG. 27 is attached using the protruding portions 71a or the protruding portions 71b.

Figure 30:
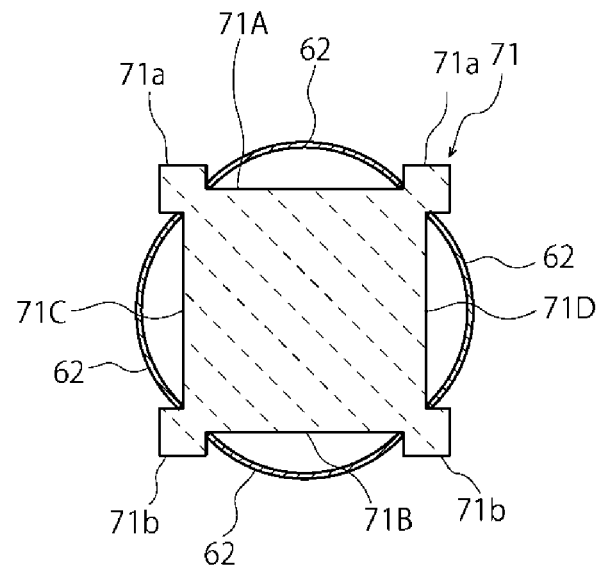
FIG. 30 is a front sectional view illustrating a structure in which four pressing contact members are attached to a movable body in the seventh embodiment of the present invention.

As illustrated in FIG. 30, a pressing contact member 62 may be attached between the protruding portions 71a on the upper surface 71A. In addition, a pressing contact member 62 can also be attached between the protruding portions 71b on the lower surface 71B. Furthermore, pressing contact members 62 can also be attached between the protruding portions 71a and 71b on the side surfaces 71C and 71D.

Figure 31:
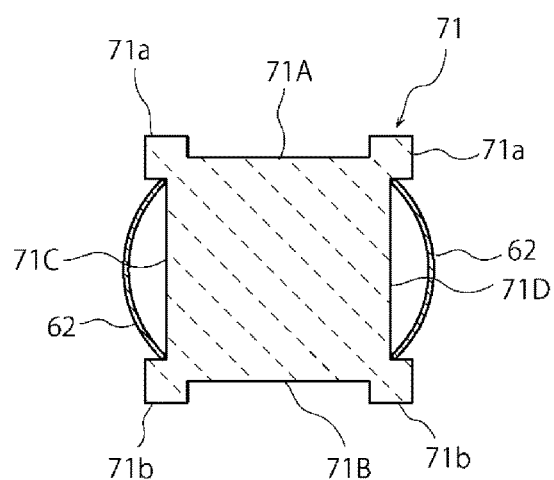
FIG. 31 is a front sectional view illustrating a structure in which two pressing contact members are attached to a movable body used in the seventh embodiment of the present invention.

Alternatively, the pressing contact members 62 may be attached to only the side surfaces 71C and 71D, as illustrated in FIG. 31.

According to an exemplary embodiment in which the pressing contact members 62 are formed of flat springs as in the sixth and seventh embodiments, the pressing contact members can be easily attached to the movable body by appropriately designing the shapes of the movable bodies 61 and 71.

With a change in perspective, the structure in which the protruding portions 61a and 61b are provided in FIG. 26 can also be interpreted as a structure in which recesses are formed in the upper surface and the lower surface of the rectangular-plate-shaped movable body 61. That is, the protruding portions 61a may be formed by forming a recess in the upper surface such that a pair of opposing walls 61a1 are formed. Alternatively, as described above, the protruding portions 61a may be formed so as to protrude upward from the upper surface of the rectangular plate shape.

(Eighth Embodiment Utilizing Coupled Mode)

In a driving device of the present invention, a plate-shaped driving unit may be configured so as to vibrate with vibration of a coupled mode in which flexural vibration and at least one type of vibration that is different to the flexural vibration are coupled with each other. An eighth embodiment in which such a coupled mode vibration is used will be described hereafter.

In a driving device according to the eighth embodiment, the piezoelectric elements illustrated in FIG. 19 are used. In addition, the rest of the configuration is the same as that of the driving device of the first embodiment except for a coupled mode being generated in a plate-shaped driving unit. Therefore, in the description of the eighth embodiment, reference is to made to the description given while referring to FIG. 8 and FIGS. 1 to 8 for the driving device according to the first embodiment and the description given while referring to FIG. 19 for the fourth embodiment.

Specifically, in the eighth embodiment, a configuration is adopted in which the dimensions of the elastic body 11 of the plate-shaped driving unit 3 are adjusted in order that a coupled mode in which flexural vibration and area expansion vibration are coupled with each other is excited. The rest of the configuration, except for the driving method, is the same as that of the first embodiment.

Figure 32:
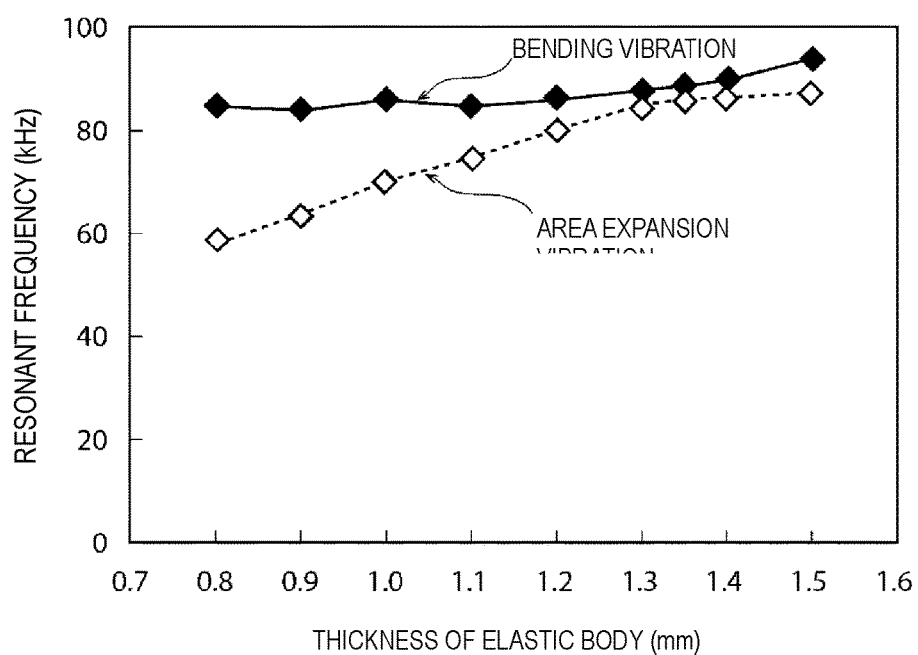
FIG. 32 illustrates the relationship between the thickness of a plate-shaped elastic body of a driving unit and the impedance of flexural vibration and area expansion vibration.

An elastic body 11 that is composed of stainless steel and has dimensions of 8.5 mm×8.5 mm and a dimension in a width direction, which connects the edge of a rectangular cavity and the outer peripheral edge, of 1.0 mm was prepared as the elastic body 11 of the driving unit 3. Driving units 3 were formed by changing the thicknesses of the elastic body 11 to various values and affixing piezoelectric elements 12 to the surfaces of the elastic bodies. The piezoelectric elements of driving units 3 of different thicknesses were driven and made to vibrate. Changes in the resonant frequencies of flexural vibration and area expansion vibration in such cases are illustrated in FIG. 32. As is clear from FIG. 32, the resonant frequency of flexural vibration does not rise very much as the thickness of the elastic body increases. In contrast, it is clear that the resonant frequency of area expansion vibration rises as the thickness of the elastic body 11 increases and approaches the resonant frequency of flexural vibration in a range where the thickness is 1.2 mm to 1.5 mm. In particular, it is clear that the resonant frequency of the flexural vibration and the resonant frequency of the area expansion vibration approach each other to the extent of being substantially the same at a thickness of 1.3 mm to 1.4 mm. In this case, the flexural vibration and the area expansion vibration couple with each other and vibration of a coupled mode is generated. The thickness of the elastic body 11 was set so that this vibration of a coupled mode is generated.

Figure 33:
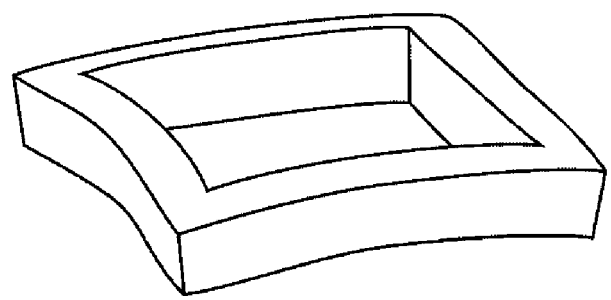
FIG. 33 illustrates the vibration shape of a driving unit in a case where a movable body is made to advance using a coupled mode in which flexural vibration and area expansion vibration are coupled with each other.
Figure 34:
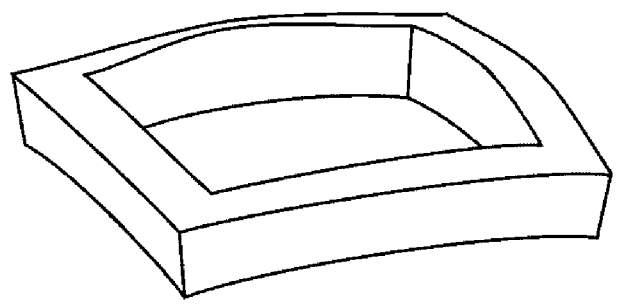
FIG. 34 illustrates the vibration shape of a driving unit in a case where a movable body is made to retreat using a coupled mode in which flexural vibration and area expansion vibration are coupled with each other.
Figure 35:
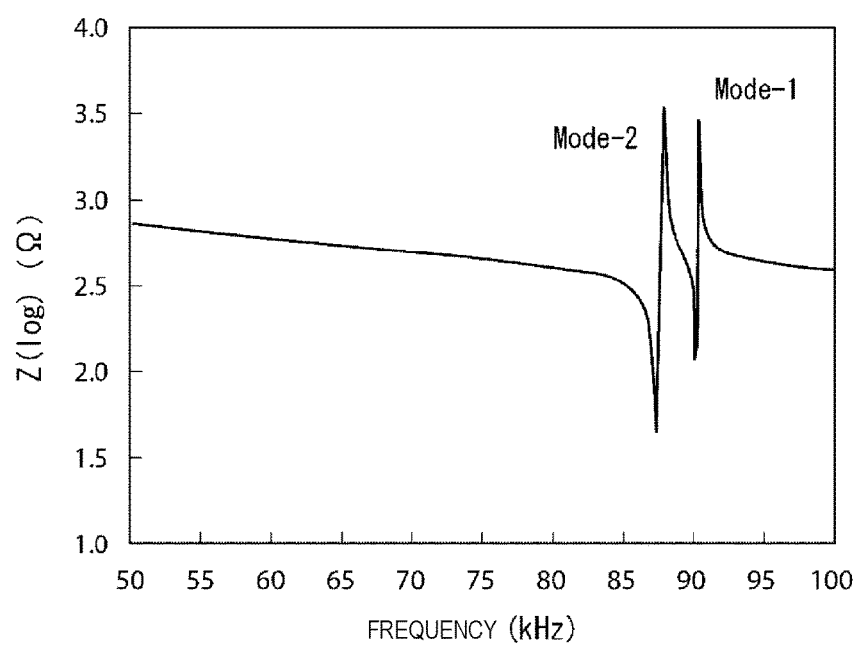
FIG. 35 illustrates impedance-frequency characteristics of vibration of a coupled mode of a driving unit in an eighth embodiment of the present invention.

More specifically, the thickness was set to 1.37 mm and a driving pulse signal was applied while changing the frequency thereof. The resonance characteristics of the driving unit 3 are illustrated in FIG. 35. As is clear from FIG. 35, there is mode 1 having a resonant frequency that appears when the driving frequency is 90.2 kHz and mode 2 in which a resonant frequency appears when the driving frequency is 87 kHz. FIG. 33 is a perspective view illustrating the vibration shape of the driving unit 3 when driven mode 1. FIG. 34 is a perspective view illustrating the vibration shape of the coupled mode when driven in mode 2.

The vibration of the coupled mode in which the flexural vibration and the area expansion vibration are coupled with each other has a vibration shape that realizes a movable state in which the inner wall of the cavity 11c of the elastic body 11 is frictionally engaged with the movable body 4 and a released state in which the inner wall of the cavity 11c is separated from the movable body or is contacting the movable body 4 with a frictional engagement force that is lower than that in the movable state. Such a vibration shape is generated in both the cases of mode 1 and mode 2. However, in mode 1, the movable body 4 moves such that the movable body 4 advances due to the coupled mode in the movable state. Whereas, in mode 2, the inner wall of the cavity 11c causes the movable body 4 to retreat in the movable state.

In other words, in this embodiment, the movable body 4 can be made to advance by vibration of the coupled mode when the coupled mode is mode 1. On the other hand, the movable body 4 can be made to retreat by switching the driving frequency so as to generate mode 2 when it is desired to make the movable body 4 retreat.

In this embodiment, the vibration of the coupled mode is formed as a result of the flexural vibration and the area expansion vibration coupling with each other. In order to achieve this coupling, the resonant frequency of the flexural vibration and the resonant frequency of the area expansion vibration should preferably match each other. Of course, the two resonant frequencies need not exactly match each other and it is sufficient that the two resonant frequencies substantially match each other. More specifically, it is sufficient that the absolute value of the difference between the resonant frequency of the flexural vibration and the resonant frequency of the area expansion vibration lie in a range of ±15% of the average value of the resonant frequency in mode 1 and the resonant frequency in mode 2, and more preferably lie within a range of ±5% of the average value. If the absolute value lies within this range, mode 1 and mode 2 can be realized with more certainty.

Figure 36:
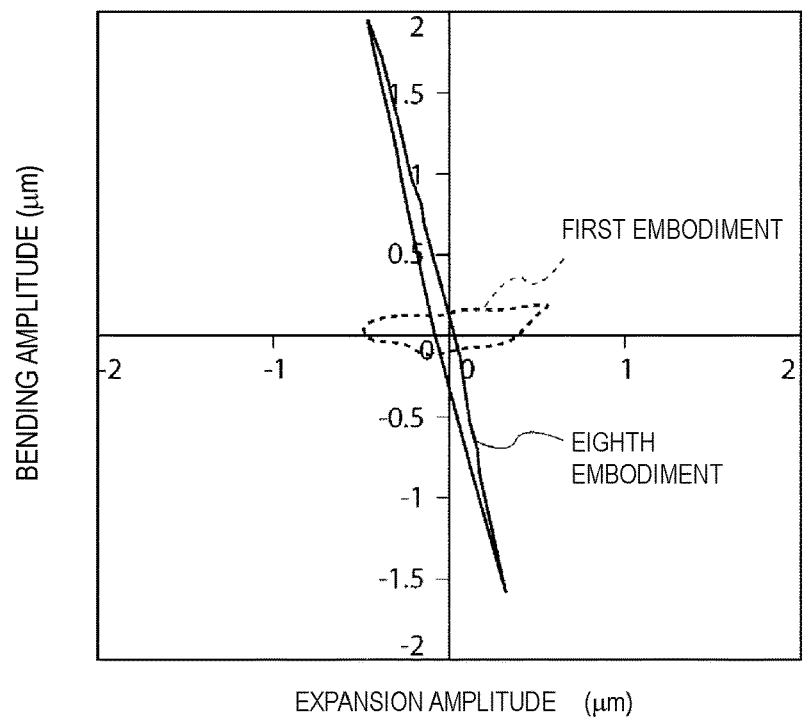
FIG. 36 illustrates the relationship between expansion amplitude and bending amplitude in vibration of the coupled mode in the eighth embodiment of the present invention and in vibration of the driving unit in the first embodiment.

By utilizing vibration of the coupled mode, the bending amplitude can be made larger in the eighth embodiment, compared with the first embodiment. This is because the bending amplitude can be made larger since the vibration has the form of simple harmonic motion. This will be explained while referring to FIG. 36. In FIG. 36, a solid line represents displacement hysteresis in the eighth embodiment and the dashed line represents displacement hysteresis in the first embodiment.

As illustrated by the dashed line in FIG. 36, in the first embodiment, the released state and the movable state are respectively realized when the expansion amplitude is negative and when the expansion amplitude is positive, and the movable body 4 can be made to advance by the magnitude of the bending amplitude.

On the other hand, in the eighth embodiment illustrated by the solid line, with the coupled mode, the released state is realized when the expansion amplitude is negative and the movable state is realized when the expansion amplitude is positive and the bending amplitude is very large in both cases. Consequently, the movable body can be made to move at high speed and a large displacement can be obtained. This will be explained in more detail while referring to FIGS. 37 to 40.

Figure 37:
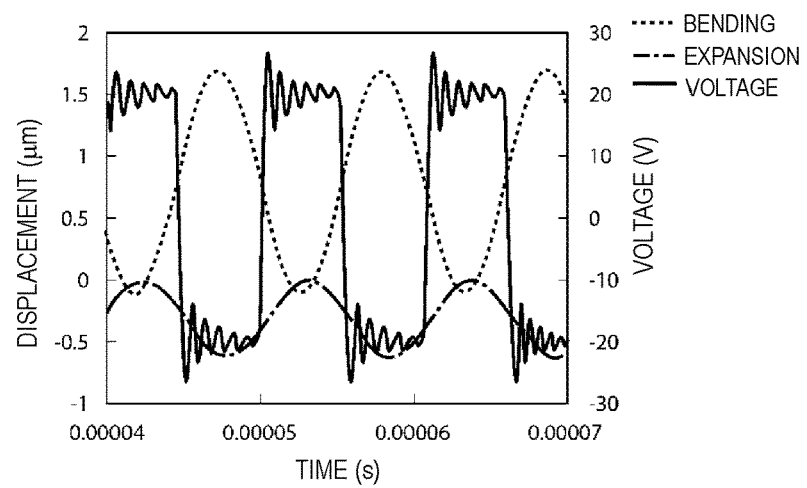
FIG. 37 illustrates the relationship between driving pulses and displacements of flexural vibration and area expansion vibration at the time of an advancement mode in the eighth embodiment of the present invention.

FIG. 37 illustrates the relationship between the driving pulses and the displacements of the flexural vibration and the area expansion vibration in the above-described mode 1. The displacement of the flexural vibration and the displacement of the area expansion vibration couple with each other and coupled mode vibration of mode 1 is realized. When drive in mode 1, the flexural vibration and the area expansion vibration are coupled with each other such that the flexural vibration and the area expansion vibration have substantially opposite phases. Therefore, the movable body 4 can be made to advance.

Figure 38:
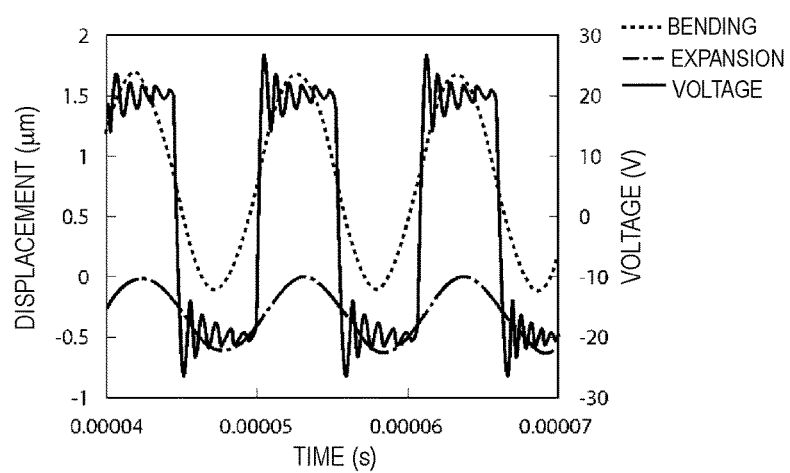
FIG. 38 illustrates the relationship between driving pulses and displacements of flexural vibration and area expansion vibration at the time of a retreat mode in the eighth embodiment of the present invention.

In contrast, as illustrated in FIG. 38, when driven in mode 2, the flexural vibration and the area expansion vibration are coupled with each other such that the phase of the flexural vibration and the phase of the area expansion vibration are substantially the same. As a result, the movable body 4 can be made to retreat in mode 2.

It is clear that in both cases the displacement of the flexural vibration is fairly large both at the time of advancement and at the time of retreat and that the flexural vibration is displaced in the form of a sine wave and therefore a large displacement is obtained.

Figure 39:
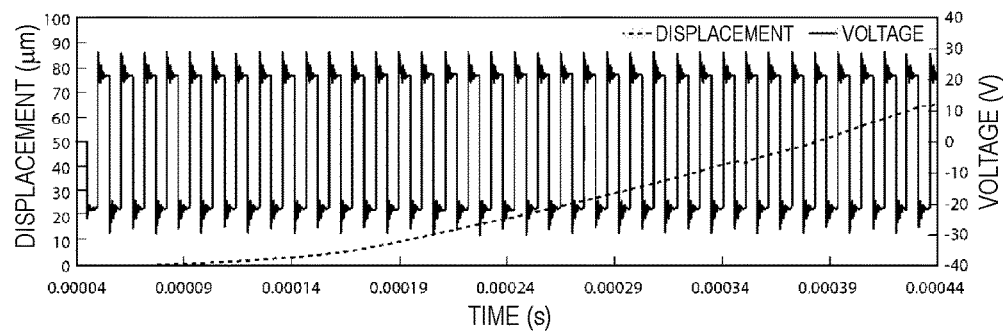
FIG. 39 illustrates a driving pulse voltage and displacement, which is the amount of movement of a movable body, in the eighth embodiment of the present invention.

FIG. 39 illustrates the driving pulses and the change in the displacement of the movable body 4 with respect to time in the driving device of the eighth embodiment. As is clear from FIG. 39, in the eighth embodiment, the movable body 4 can be made to move from the very start of driving and the movable body 4 can be made to move at a high speed. Furthermore, as is clear from FIG. 39, in the eighth embodiment, the movable body 4 is unlikely to move backward.

Figure 40:
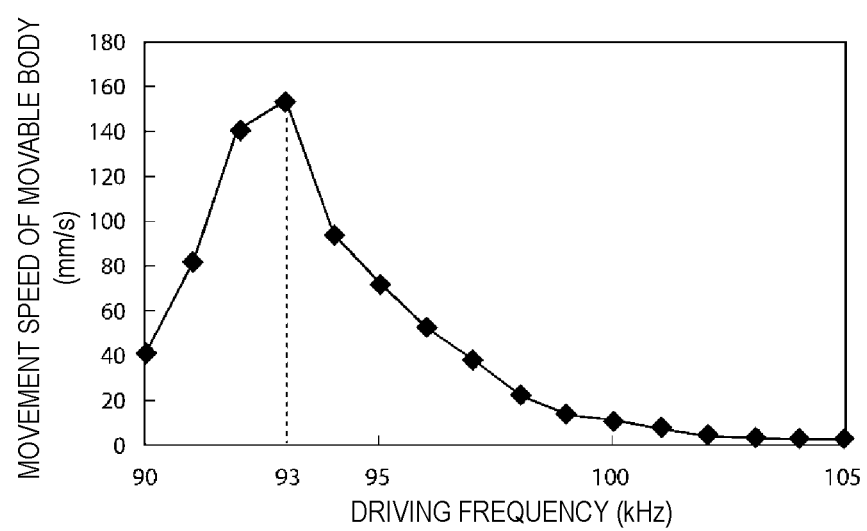
FIG. 40 illustrates the relationship between the driving frequency of driving pulses and the movement speed of a movable body in the eighth embodiment of the present invention.

FIG. 40 illustrates the relationship between the driving frequency of the driving pulses and the speed of the movable body.

In the eighth embodiment, when the frequency of the driving pulses is changed, a coupled mode of mode 1 or mode 2 is strongly excited, as described above. FIG. 40 illustrates the relationship between the driving frequencies around a driving frequency at which mode 1 is generated and the speed of the movable body. It is clear that the movable body 4 can be moved at the highest speed when the driving frequency is 93 kHz in this embodiment. Furthermore, it is clear that the movable body 4 can be moved with a sufficiently high speed when the driving frequency is in the range of 90 to 97 kHz. This is because the coupled mode of mode 1 is strongly excited in this frequency range.

Although not illustrated in FIG. 40, a frequency range in which the coupled mode of mode 2 described above is strongly excited appears in a frequency range lower than 90 kHz. Therefore, the movable body 4 can be made to advance or retreat with mode 1 or mode 2 by changing the driving frequency.

Although a coupled mode in which flexural vibration and area expansion vibration are coupled with each other is used in the eighth embodiment, the other type of vibration that is coupled with the flexural vibration is not limited to being area expansion vibration. That is, so long as the vibration can couple with the flexural vibration, another type of vibration that is similar to the other type of vibration in the first embodiment described above can be used.

Furthermore, although coupled mode vibration is generated by adjusting the thickness of the elastic body 11 in the eighth embodiment, the coupled mode vibration may be generated by considering not only the thickness of the elastic body 11 but also the other dimensions and the material of the elastic body 11, for example.

As described above, the eighth embodiment differs from the first and fourth embodiments in that the coupled mode vibration is used and therefore the rest of the configuration can be appropriately modified in ways described in the first embodiment, the modification of the first embodiment, and the second, third and fifth to seventh embodiments. Therefore, the description of the modification of the first embodiment and descriptions of the second, third and fifth to seventh embodiments are to be also referred to in the description of the driving device of the eighth embodiment.

As is clear from the first to eighth embodiments, the planar shape of the cavity or the outer shape of the elastic body may be a circular shape or may be a non-circular anisotropic shape such as a rectangular shape. In the embodiment of a non-circular anisotropic shape, the resonant frequency of the flexural vibration and the resonant frequency of the other type of vibration can be easily adjusted by adjusting the dimensions of the elastic body as described above. Therefore, it is preferable according to this embodiment that the planar shape of the elastic body and the planar shape of the cavity of the elastic body be a non-circular anisotropic shape. It is further preferable that both the planar outer shape of the elastic body and the planar shape of the cavity be non-circular shapes.

REFERENCES SIGNS LIST

1 . . . driving device
2 . . . support
2a . . . plate
2b . . . through hole
2c . . . supporting protrusion
3 . . . driving unit
4 . . . movable body
5 . . . holder
5a . . . groove
6 . . . lens
7 . . . transparent plate
8 . . . pressing contact member
11 . . . elastic body
11a . . . upper surface
11b . . . lower surface
11c . . . cavity
12, 12A . . . piezoelectric element
12a . . . through hole
13 . . . piezoelectric body
14, 15 . . . electrode
16 . . . driving pulse source
31 . . . driving device
33 . . . driving unit
34 . . . elastic body
34c . . . cavity
35 . . . piezoelectric element 41 . . . elastic body
42 . . . piezoelectric element
43 . . . driving unit
51 . . . driving device
53 . . . driving unit
54 . . . movable body
58 . . . pressing contact member
58a, 58b . . . first, second end portion
58c . . . repelling portion
61, 71 . . . movable body
61a, 61b, 71a, 71b . . . protruding portion
61a1 . . . opposing wall
62 . . . pressing contact member
71A . . . upper surface
71B . . . lower surface
71C, 71D . . . side surface

The invention claimed is:

1. A driving device comprising:
a plate-shaped driving unit that includes an elastic body having first and second surfaces opposing each other and a cavity extending from the first surface to the second surface in a center of the elastic body, and a piezoelectric element disposed on at least one of the first and second surfaces of the elastic body; and
a movable body disposed in the cavity of the elastic body and configured to move in a direction orthogonal to the first and second surfaces when the driving unit is driven;
wherein the elastic body comprises a non-circular outer shape in a plan view of the elastic body when viewed from a side of the first surface,
wherein the plate-shaped driving unit is configured to vibrate with flexural vibration and at least one other type of vibration or with a vibration of a coupled mode in which the flexural vibration and the at least one other type of vibration are coupled with each other when the piezoelectric element is driven,
wherein the at least one other type of vibration or the vibration of the coupled mode has a vibration shape that creates a movable state in which an inner wall of the cavity of the elastic body is frictionally engaged with the movable body such that the elastic body causes the movable body to move and a released state in which the inner wall of the cavity of the elastic body is not engaged with the movable body or only contacts the movable body with a frictional engagement force such that the elastic body cannot cause the movable body to move.

2. The driving device according to claim 1,
wherein the plate-shaped driving unit is configured to vibrate with the flexural vibration and the at least one other type of vibration when the piezoelectric element being driven, and the other type of vibration has a vibration shape that creates a movable state in which the inner wall of the cavity of the elastic body is frictionally engaged with the movable body such that the elastic body causes the movable body to move by the flexural vibration and a released state in which the inner wall of the cavity of the elastic body is not engaged with from the movable body or only contacts the movable body with a frictional engagement force such that the elastic body cannot cause the movable body to move, and
wherein the movable body is configured to move by being pitch fed by the flexural vibration and the other type of vibration of the driving unit.

3. The driving device according to claim 1, wherein the flexural vibration and the other type of vibration are driven to have a same period of vibration.

4. The driving device according to claim 1,
wherein the plate-shaped driving unit is configured to vibrate with the vibration of the coupled mode when the piezoelectric element is driven,
wherein the vibration of the coupled mode has a vibration shape that creates a movable state in which the inner wall of the cavity of the elastic body is frictionally engaged with the movable body such that the elastic body causes the movable body to move and a released state in which the inner wall of the cavity of the elastic body is not engaged with from the movable body or only contacts the movable body with a frictional engagement force such that the elastic body cannot cause the movable body to move, and
wherein the movable body is configured to move by the vibration of the coupled mode of the driving unit.

5. The driving device according to claim 4, wherein dimensions of the elastic body are adjusted such that the flexural vibration and the other type of vibration couple with each other and the coupled mode is excited.

6. The driving device according to claim 1, wherein the elastic body comprises a planar non-circular anisotropic shape.

7. The driving device according to claim 6, wherein the cavity comprises a planar non-circular anisotropic shape.

8. The driving device according to claim 1, wherein the movable body has a side surface configured to frictionally engage with the elastic body and the side surface includes a pressing contact member that increases a frictional engagement force against the elastic body.

9. The driving device according to claim 8, wherein the pressing contact member is ring-shaped and extends in peripheral direction of the movable body on the side surface and the pressing contact member exerts a repulsive force from the side surface when the pressing contact member is attached to the side surface of the movable body.

10. The driving device according to claim 9, wherein the side surface of the movable body comprises a groove and the pressing contact member is disposed in the groove.

11. The driving device according to claim 8,
wherein the pressing contact member comprises a plurality of spring members that each have a length direction that connects a first end portion thereof and a second end portion thereof that is on a side opposite to the first end portion, each of the spring members is configured such that a part thereof between the first end portion and the second end portion can be displaced in a direction orthogonal to the length direction, and
wherein the first and second end portions of each spring member are fixed to the side surface of the movable body and the part of each spring member between the first and second end portions is bent such that the part is urged in a direction away from the side surface of the movable body and an apex of the part press contacts the elastic body.

12. The driving device according to claim 1, wherein the plate-shaped elastic body comprises a planar shape that is different than a planar shape of the piezoelectric element.

13. The driving device according to claim 1, wherein the piezoelectric element has a cavity in a center thereof that is larger than the cavity of the elastic body such that the piezoelectric element does not extend to a peripheral edge of the cavity of the elastic body.

14. The driving device according to claim 1, wherein the piezoelectric element comprises a plurality of piezoelectric elements.

15. The driving device according to claim 1, further comprising a driving pulse source that is electrically connected to the piezoelectric element and is configured to supply driving pulses to the piezoelectric element such that the flexural vibration and the at least one other type of vibration have a same period of vibration.

16. A driving device comprising:
- a plate-shaped driving unit that includes an elastic body having first and second main surfaces opposing each other and a cavity extending from the first surface to the second surface in a center of the elastic body, and a piezoelectric element disposed on at least one of the first and second surfaces of the elastic body; and
- a movable body disposed in the cavity of the elastic body and configured to move in a direction orthogonal to the first and second surfaces when the driving unit being driven;
- wherein the elastic body comprises a non-circular outer shape in a plan view of the elastic body when viewed from a side of the first main surface,
- wherein the plate-shaped driving unit is configured to vibrate with flexural vibration and at least one other type of vibration or with a vibration of a coupled mode in which the flexural vibration and the at least one other type of vibration that is different to the flexural vibration are coupled with each other when the piezoelectric element is driven,
- wherein the at least one other type of vibration or the vibration of the coupled mode has a vibration shape that creates a movable state in which an inner wall of the cavity of the elastic body is frictionally engaged with the movable body such that the elastic body causes the movable body to move and a released state in which the inner wall of the cavity of the elastic body is not engaged with the movable body or only contacts the movable body with a frictional engagement force such that the elastic body cannot move the movable body,
- wherein the driving device further comprises a driving pulse source that is electrically connected to the piezoelectric element and that is configured to supply driving pulses to the piezoelectric element to generate the flexural vibration and the other type of vibration are generated or the vibration of the coupled mode.

17. The driving device according to claim 16, wherein the plate-shaped driving unit is configured to vibrate with the flexural vibration and the at least one other type of vibration, and the driving pulse source is configured to supply the driving pulses to the piezoelectric element such that the flexural vibration and the other type of vibration are generates with a same period of vibration, such that the movable body is pitch fed by the flexural vibration and the other type of vibration.

18. The driving device according to claim 16, wherein the driving unit is configured to vibrate with the vibration of the coupled mode and the driving pulse source is configured to supply the driving pulses to the piezoelectric element to generate the vibration of the coupled mode.

19. The driving device according to claim 16, wherein the elastic body of the driving unit comprises a planar non-circular anisotropic shape.

20. The driving device according to claim 19, wherein the cavity of the elastic body of the driving unit comprises a planar non-circular anisotropic shape.

* * * * *